US005694353A

United States Patent [19]

Koike

[11] Patent Number: 5,694,353
[45] Date of Patent: Dec. 2, 1997

[54] NON-VOLATILE FERROELECTRIC MEMORY DEVICE EQUIPPED WITH REFERENCE VOLTAGE GENERATOR FOR EXACTLY REGULATING REFERENCE VOLTAGE TO THE MID POINT BETWEEN TWO LOGIC LEVEL AND METHOD OF READING OUT DATA BIT THEREFROM

[75] Inventor: Hiroki Koike, Tokyo, Japan

[73] Assignee: NEC Corporation, Tokyo, Japan

[21] Appl. No.: 718,828

[22] Filed: Sep. 24, 1996

[30] Foreign Application Priority Data

Sep. 29, 1995 [JP] Japan ................. 7-277171

[51] Int. Cl.$^6$ ................................. G11C 11/22
[52] U.S. Cl. ............... 365/145; 365/149; 365/203; 365/210
[58] Field of Search ................. 365/145, 149, 365/203, 210

[56] References Cited

U.S. PATENT DOCUMENTS 5,430,671  7/1995  Hirand et al. ................. 365/145
5,572,459  11/1996  Wilson et al. ................. 365/145

OTHER PUBLICATIONS

Tatsumi Sumi et al., "A 256kb Nonvolatile Ferroelectric Memory at 3V and 100ns", *1994 IEEE International Solid-State Circuits Conference*, pp. 268–269.

Primary Examiner—David C. Nelms
Assistant Examiner—F. Niranjan
Attorney, Agent, or Firm—Sughrue,Mion,Zinn,Macpeak & Seas, PLLC

[57] ABSTRACT

A non-volatile ferroelectric memory cell supplies electric charge from the ferroelectric capacitor to one of bit lines so as to rise the bit line to one of a first potential level representative of logic "1" level and a second potential level representative of logic "0" level, and a reference voltage generator generates a reference voltage level exactly adjusted to the mid point between the first potential level and the second potential level by supplying electric charge from a dummy memory cell storing a dummy data bit of logic "1" level and another dummy memory cell storing a dummy data bit of logic "0" level to the other of the bit lines and an adjacent bit line.

14 Claims, 20 Drawing Sheets

NON-VOLATILE FERROELECTRIC MEMORY DEVICE EQUIPPED WITH REFERENCE VOLTAGE GENERATOR FOR EXACTLY REGULATING REFERENCE VOLTAGE TO THE MID POINT BETWEEN TWO LOGIC LEVEL AND METHOD OF READING OUT DATA BIT THEREFROM

FIELD OF THE INVENTION

This invention relates to a non-volatile ferroelectric memory device and, more particularly, to a non-volatile ferroelectric memory device having ferroelectric capacitors for storing data bits.

DESCRIPTION OF THE RELATED ART

Ferroelectric substance such as lead zircon titanate (which is abbreviated as "PZT") is an attractive substance, because the hysteresis is available for a data storage. The hysteresis maintains a data bit without electric power, and such a non-volatile ferroelectric memory is hereinbelow referred to a ferroelectric memory.

FIG. 1 illustrates an example of the ferroelectric memory cell of the type consisting of one-transistor and one-capacitor per bit. A field effect transistor 1a is coupled in series to a ferroelectric capacitor 1b, and the field effect transistor 1a and the ferroelectric capacitor 1b form the ferroelectric memory cell 1. A word line WL1 is connected to the gate electrode of the field effect transistor 1a, and a bit line BL1 is connected to the drain node of the field effect transistor 1a. The source node is connected to one electrode of the ferroelectric capacitor 1b, and the other electrode of the ferroelectric capacitor 1b is connected to a plate line PL1.

When the word line WL1 is changed to an active level, the field effect transistor 1a turns on, and the bit line BL1 is electrically connected to the ferroelectric capacitor 1b. While the bit line BL1 is being connected to the ferroelectric capacitor 1b, a data bit is written into or read out from the ferroelectric capacitor 1b. On the other hand, when the word line WL1 is recovered to an inactive level, the field effect transistor 1a turns off, and the ferroelectric capacitor 1b maintains a data bit without electric power.

FIG. 2 illustrates relation between the spontaneous polarization charge Q of the ferroelectric capacitor 1b and a potential level applied between the two electrodes of the ferroelectric capacitor 1b. A hysteresis takes place between the spontaneous polarization charge Q and the potential level. Even though the potential level is zero, the spontaneous polarization charge Q at "A" is different from the spontaneous polarization charge Q at "B", and "A" and "B" are assigned two logic levels "1" and "0" of a stored data bit. Thus, the ferroelectric capacitor 1b maintains the difference between "A" and "B" without the potential level between the electrodes, and is available for a non-volatile data storage.

When a potential level Ve is applied between the two electrodes of the ferroelectric capacitor 1b with the spontaneous polarization charge Q at "A", the ferroelectric capacitor 1b discharges a large amount of electric charge Q1 through the field effect transistor 1a to the bit line BL1. On the other hand, when the same potential level Ve is applied between the electrodes of the ferroelectric capacitor 1b with the spontaneous polarization charge Q at "B", the ferroelectric capacitor 1b discharges a small amount of electric charge Q0 through the field effect transistor 1a to the bit line BL1. Thus, the ferroelectric capacitor 1b differently drives the bit line BL1 depending upon the logic level of the stored data bit.

FIG. 3 illustrates a prior art non-volatile ferroelectric memory device. The prior art non-volatile ferroelectric memory device comprises a memory cell array 1, and the memory cell array 1 is associated with bit line pairs BLP1 to BLPn, word lines WL1, WL2 to WLm and plate lines PL1, PL2 to PLm. A plurality of memory cells MC11–MC1n, MC21–MC2n, . . . and MCm1–MCmn are incorporated in the memory cell array 1, and are arranged in rows and columns. The word lines WL1 to WLm are respectively paired with the plate lines PL1 to PLm, and the pairs of word/plate lines are respectively associated with the rows of memory cells MC11–MC1n, MC21–MC2n to MCm1–MCmn. The bit line pairs BLP1 to BLPn are respectively associated with the columns of memory cells MC11/MC21/MCm1 to MC1n/MC2n/MCmn, and the memory cells MC11/MC21/MCm1 or MC1n/MC2n/MCmn of each column are alternately coupled to the bit lines BLa and BLb of the associated bit line pair BLP1/BLPn.

An n-channel enhancement type switching transistor SW1 and a ferroelectric capacitor FC are coupled in series, and form each of the plurality of memory cells MC11–MC3n. The associated word line WL1/WL2/WLm is connected to the gate electrode of the n-channel enhancement type switching transistor SW1, and the bit line BLa/BLb is electrically connectable to one of the electrodes of the ferroelectric capacitor FC. The plate line PL1/PL2/PL3 is connected to the other of the electrodes of the ferroelectric capacitor FC.

The prior art non-volatile ferroelectric memory device further comprises precharge/balancing circuits 21 to 2n connected to the bit line pairs 21 to 2n, and a series of n-channel enhancement type switching transistors SW2 and SW3 is connected between the bit lines BLa and BLb of the associated pair. A precharge voltage Vbp is supplied through a precharge line VBP to the n-channel enhancement type switching transistors SW2 and SW3, and a precharge control signal PBL is concurrently supplied to the gate electrodes of the n-channel enhancement type switching transistors SW2 and SW3 of the precharge/balancing circuits 21 to 2n.

The prior art non-volatile ferroelectric memory device further comprises reference voltage generators DC1a/DC1b to DCna/DCnb, and the reference voltage generators DC1a–DCna and DC1b–DCnb are responsive to control signals DWLa and DWLb, respectively, for biasing the bit lines BLa or BLb to a reference voltage. The control signals DWLa and DWLb are selectively changed to an active level.

The prior art non-volatile memory device further comprises differential amplifiers SAMP1 to SAMPn respectively connected to the bit line pairs BLP1–BLPn. The differential amplifiers SAMP1 to SAMPn are responsive to a control signal SE so as to magnify potential difference between the bit lines BLa and BLb of the associated bit line pairs BLP1 to BLPn, respectively. As described hereinbefore, the ferroelectric capacitor FC supplies the electric charge Q through the n-channel enhancement type switching transistor SW1 to the bit line BLa or BLb, and the amount of electric charge Q1/Q0 is dependent on the logic level of the stored data bit. The electric charge Q1/Q0 changes the potential level on the associated bit line BLa or BLb, and the reference generator gives the reference voltage to the other bit line BLb or BLa. For this reason, a small potential difference takes place between the bit lines BLa and BLb of the associated bit line pair. The reference voltage is adjusted to a mid voltage between a high potential level due to the electric charge Q1 and a low potential level due to the electric charge Q0.

FIG. 4 illustrates the behavior of the prior art non-volatile ferroelectric memory device. A data bit of logic "1" level stored in the memory cell MC11 is assumed to be selected from the memory cell array 1 in the following description. The data bit of logic "1" level is represented by polarization status PS1 of the ferroelectric capacitor FC. Although the following events concurrently affect the other memory cells in the same row, description is focused on the memory cell MC11, only. Terms "high level" and "low level" mean a positive power voltage and the ground voltage level, unless description gives other definition. All of the bit lines BLa and BLb have been precharged to the ground level in the presence of the precharge control signal PBL of the active high level before time t1.

The precharge control signal PBL starts to go down to the inactive low level at time t1, and the bit lines BLa are electrically isolated from the bit lines BLb, respectively.

The word line WL1 and the plate line PL1 start to rise at time t2, and the control signal DWLa concurrently starts to rise. However, the other word lines WL2-WLm, the other plate lines PL2-PLm and the control signal DWLb remain in the low level. The word line WL1 causes the n-channel enhancement type switching transistor SW of the memory cell MC11 to turn on, and the ferroelectric capacitor FC is electrically connected through the n-channel enhancement type switching transistor SW to the bit line BLb. The plate line PL1 biases the ferroelectric capacitor FC of the memory cell MC11 by −Ve (see FIG. 2), and the large amount of electric charge Q1 is supplied from the ferroelectric capacitor FC to the bit line BLb. The control signal DWLa causes the reference voltage generator DC1a to charge the bit line BLa to the reference voltage. As a result, a small potential difference takes place between the bit lines BLa and BLb of the bit line pair BLP, and the polarization status is changed to PS2 corresponding to "h" in FIG. 2. If the memory cell MC11 stores a data bit of logic "0" level, the polarization status is also changed to PS2 after the supply of the electric charge to the bit line BLa. The polarization status PS2 does not represent neither logic "1" level nor logic "0" level.

The control signal SE starts to rise at time t3, and causes the differential amplifier SAMP1 to magnify the potential difference on the bit line pair BLP1. The polarization status is changed to PS3. After the magnification, the potential difference representative of the data bit of logic "1" level is transferred through a selector (not shown) to a data input/output circuit (not shown).

When the ferroelectric capacitor FC of the memory cell MC11 supplied the large amount of electric charge Q1 to the bit line BLb, the ferroelectric substance changed the polarization status from PS1 to PS2, and the stored data bit was destroyed. For this reason, it is necessary to repair the data bit as follows.

The control line DWLa starts to decay at time t4, and the reference voltage generator DC1a is deactivated. This is corresponding to a bias of +Ve to the ferroelectric capacitor FC, and the polarization status is changed to PS4. If the stored data bit is logic "0" level, zero volt is biased to the ferroelectric capacitor FC.

Subsequently, the control signal SE starts to decay at time t5, and deactivates the differential amplifier SAMP1. The precharge signal PBL starts to rise at time t6, and the precharge/balancing circuits 21 to 2n equalizes the bit lines BLa and BLb at the ground level. As a result, the polarization status is changed to PS5 corresponding to the initial polarization status PS1.

Finally, the word line WL1 and the plate line PL1 start to decay at time t7. The bias Ve is removed from the ferroelectric capacitor FC, and the n-channel enhancement type switching transistor SW1 turns off so as to electrically isolate the ferroelectric capacitor FC from the bit line BLa. The ferroelectric capacitor FC maintains the initial polarization status PS1.

When the data bit stored in the memory cell MC11 is rewritten to logic "0" level, a potential difference representative of logic "0" level is applied to the bit line pair BLP1, and the data bit of logic "0" level is stored in the memory cell MC11 through phase-4 to phase-6.

The prior art memory device shown in FIGS. 3 and 4 drives the plate lines PL1 to PLm and the bit lines BLa/BLb between the low level and the high level so as to selectively apply the positive bias and the negative bias between the electrodes of each ferroelectric capacitor FC. These two kinds of bias condition result in a write-in to logic "0" level and logic "1" level.

FIG. 5 illustrates another prior art non-volatile ferroelectric memory device. The prior art non-volatile ferroelectric memory device shown in FIG. 5 is similar to that shown in FIG. 3 except for a bias level of the plate lines PL1 to PLm driven to an intermediate voltage level between the high level and the low level. For this reason, signal lines, memory cells and other circuits of the second prior art are labeled with the references designating corresponding signal lines, memory cells and circuits incorporated in the first prior art.

The second prior art non-volatile ferroelectric memory device further comprises bit line balance controlling circuits 31 to 3n respectively coupled to the bit line pairs BLP1 to BLPn. The bit line balance controlling circuits 31 to 3n are responsive to a control signal EBL for changing the bit lines BLa/BLb to an intermediate level Vm.

Assuming now that a data bit of logic "1" level is read out from the memory cell MC11, the precharge control signal starts to decay at time t11, and the precharge/balancing circuits 21 to 2n complete the precharging on the bit lines BLa and BLb in phase 1. The precharging level is the ground level.

The word line WL1 is changed to the high level in phase 2, and the word line WL1 causes the n-channel enhancement type switching transistor SW1 of the memory cell MC11 to turn on. As a result, the bit line BLb of the bit line pair BLP1 is electrically connected through the n-channel enhancement type switching transistor SW1 to the ferroelectric capacitor FC. However, the plate line PL1 is not changed, and is maintained at the intermediate level Vm through phase 1 to phase 7. The potential difference −Vm is applied to both electrodes of the ferroelectric capacitor FC, because the bit line BLa and the plate line PL1 are in the ground level and the intermediate level Vm, respectively. Then, the polarization status is changed from PS1 to PS2, and a large amount of electric charge is supplied from the ferroelectric capacitor FC to the bit line BLb.

The control signal DWLa is changed to the active high level in phase 2, and the reference voltage generator DC1a supplies the reference voltage to the bit line BLa. As a result, a small potential difference takes place on the bit line pair BLP1.

The control signal SE is changed to the active level in phase 3, and the differential amplifier SAMP1 magnifies the potential difference on the bit line pair BLP1. The polarization status is changed to PS3 after the differential amplification. The potential difference is transferred from the bit line pair BLP1 to a data input/output circuit (not shown).

If a new data bit is written into the memory cell MC11, a potential difference representative of the new data bit is transferred to the bit line pair BLP1 in phase 4.

The control signal SE is changed to the low level in phase 5, and the differential amplifier SAMP1 is deactivated. The control signal EBL is changed to the active high level in phase 5, and the bit lines BLa and BLb are regulated to the intermediate level Vm. As a result, the polarization status is changed to PS5 equivalent to the initial polarization status PS1.

The word line WL1 and the control line DWLa are changed to the low level in phase 6, and the precharge control signal PBL is changed to the high level so as to ground the bit lines BLa and BLb in phase 7. The access to the memory cell MC11 is completed.

As described hereinbefore, the ferroelectric capacitor FC is available for a data storage, and the amount of electric charge discharged to the bit line is in dependent on the potential difference between the two electrodes of the capacitor FC. If a larger potential difference is applied between the two electrodes, a larger amount of electric charge is supplied from the ferroelectric capacitor to a bit line. The potential difference between the two electrodes is determined by the potential level on the plate line and the amplitude on the bit line pair through the differential amplification. There is no limit on the potential level on the plate line and the amplitude on the bit line pair in so far as the differential amplifier can magnify potential difference due to the electric charge supplied from the ferroelectric capacitor to the bit line. For example, a plate line and the amplitude on a bit line pair may be designed to be a half of a positive power voltage and the potential difference between the positive power voltage and the ground level. The positive power voltage may be equal to an electric power supplied from the outside or internally generated at a different level from the external electric power.

The amount of electric charge supplied from the ferroelectric capacitor FC and the reference voltage determines the potential difference initially generated on the bit line pair. The reference voltage generators DC1a/DC1b to DCna/DCnb are expected to exactly provide the reference voltage to the bit lines BLa or BLb.

A typical example of the reference voltage generator is disclosed by Sumi et. al. in "A 256 kb Nonvolatile Ferroelectric Memory at 3V and 100 ns", the proceedings of 1994 IEEE International Solid-State Circuit Conference, page 268. FIG. 7 illustrates the prior art reference voltage generators DMCa/DMCb together with memory cells MCa/MCb, a precharge/balancing circuit PC and a differential amplifier SAMP.

The memory cells MCa/MCb are coupled between the bit lines BLa/BLb and a plate line PL, and an n-channel enhancement type switching transistor SW4 and a ferroelectric capacitor FC form each of the memory cells MCa/MCb. Word lines WL10 and WL11 are connected to the gate electrodes of the n-channel enhancement type switching transistors SW4, and are selectively driven to an active high level so as to electrically connect the ferroelectric capacitor FC to the bit line BLa or BLb.

The precharge/balancing circuit PC is similar in circuit arrangement to those shown in FIG. 5, and signals and transistors are labeled with the references designating the corresponding signals and the transistors.

The differential amplifier SAMP is implemented by two complementary inverters, i.e., two series combinations of p-channel enhancement type field effect transistors Qp1/Qp2 and n-channel enhancement type field effect transistors Qn1/Qn2. The two complementary inverters Qp1/Qn1 and Qp2/Qn2 are coupled between two different power voltage lines SAP and SAN, and the common drain nodes N1 and N2 are connected to the gate electrodes of the complementary inverter Qp2/Qn2 and the gate electrodes of the complementary inverter Qp1/Qn1. The common drain nodes N1 and N2 are further connected to the bit lines BLa and BLb, respectively, and the complementary inverters Qp1/Qn1 and Qp2/Qn2 complementarily couple the common drain nodes N1 and N2 to the power voltage lines SAP and SAN depending upon a potential difference between the bit lines BLa and BLb.

The reference voltage generators DMCa and DMCb are respectively coupled to the bit lines BLa and BLb, and are called as "dummy memory cells". This is because of the fact that a memory cell and an n-channel enhancement type compensating transistor form each of the reference voltage generators DMCa/DMCb. In detail, the reference voltage generator DMCa/DMCb includes a series of an n-channel enhancement type switching transistor SW5 and a dummy ferroelectric capacitor DFC coupled between the bit line BLa/BLb and a dummy plate line DPL and an n-channel enhancement type compensating transistor Qn3 coupled between the source nodes of the n-channel enhancement type switching transistor SW5 and a ground line GND. Dummy word lines DWLa and DWLb are respectively coupled to the gate electrode of the n-channel enhancement type switching transistor SW5 of the reference voltage generator DMCa and the gate electrode of the n-channel enhancement type switching transistor SW5 of the other reference voltage generator DMCb, respectively. The n-channel enhancement type compensating transistors Qn3 are gated by a control line CDWL.

The dummy ferroelectric capacitor DFC has a hysteresis different from that of the ferroelectric capacitor FC as shown in FIG. 8. The ferroelectric capacitor FC has a relatively small hysteresis labeled with "FC", and two logic levels "1" and "0" are equivalent to the polarization status "e" and "a", respectively. On the other hand, the dummy ferroelectric capacitor DFC has a relatively large hysteresis labeled with "DFC".

When the ferroelectric capacitor FC is biased to −Ve, the ferroelectric capacitor FC supplies the electric charge Q1 or Q0 depending upon the logic level of the stored data bit. The parasitic capacitance of the bit line BLa/BLb is Cb, the bit line BLa/BLb raises the potential level to V0 or V1.

$$V0 = Q0/Cb \tag{1}$$

$$V1 = Q1/Cb \tag{2}$$

where V0 is the potential level on the bit line due to the electric charge Q0 and V1 is the potential level on the bit line due to the electric charge Q1.

On the other hand, the dummy ferroelectric capacitor DFC has the polarization status at "A", and supplies electric charge Qref in the presence of the bias voltage at −Ve. The electric charge Qref is greater than the electric charge Q0 and less than the electric charge Q1. The electric charge Qref raises the potential level on the other bit line BLb/BLa to Vref as given by equation 3.

$$Vref = Qref/Cb \tag{3}$$

The reference voltage level Vref is higher than the potential level Vo and lower than the potential level V1. Thus, the dummy ferroelectric capacitor DFC puts the reference voltage level Vref between the potential levels V0 and V1.

The aforementioned paper teaches that the hysteresis DFC is regulable by changing the dimensions of the dummy ferroelectric capacitor DFC.

FIG. 9 illustrates a sequence of data access to the memory cell MCb, and the data access is basically similar to those of the first and second prior art non-volatile ferroelectric memory devices. The prior art non-volatile ferroelectric memory device shown in FIG. 7 is different from the other prior art non-volatile ferroelectric memory devices in that the reference voltage generator DMCa is controlled in phases 1, 2, 4 and 5.

In detail, the control line CDWL is changed to the low level in phase 1, and the dummy ferroelectric capacitors DFC are electrically isolated from the dummy plate line DPL. As a result, the dummy ferroelectric capacitor DFC changes the polarization status to "A" (see FIG. 8). The dummy word line DWLa is changed to the high level in phase 2, and causes the n-channel enhancement type switching transistor SW5 of the reference voltage generator DMCa to turn on. As a result, the electric charge Qref is supplied from the dummy ferroelectric capacitor DFC to the bit line BLa, and the bit line BLa is changed to the reference voltage level Vref.

The dummy word line DWLa and the control line CDWL are recovered to the initial levels in phases 4 and 5, and the polarization status of the dummy ferroelectric capacitor DFC is controlled along the line A-G-H.

However, the prior art reference voltage generator encounters a problem in that the reference voltage level Vref fails to fall between the potential levels V1 and V0. As described hereinbefore, the dimensions of a ferroelectric capacitor determine the hysteresis characteristics. However, the dimensions are strongly affected by fluctuations in the fabrication process. If one of the ferroelectric capacitors coupled to a bit line pair or one of the dummy ferroelectric capacitors coupled to the same bit line pair is seriously affected by the fluctuation, the column of memory cells is not available for a data storage.

SUMMARY OF THE INVENTION

It is therefore an important object of the present invention to provide a non-volatile ferroelectric memory device reference voltage generators of which generate a reference voltage exactly falling between potential levels representative of two logic levels.

It is also another important object of the present invention to provide a method of reading out a data bit from a memory cell incorporated in said non-volatile ferroelectric memory device.

To accomplish the object, the present invention proposes to share the total of a large amount of electric charge representative of a first logic level and a small amount of electric charge representative of a second logic level between bit lines disconnected from selected memory cells and a capacitive means as large in capacitance as the bit lines.

In accordance with one aspect of the present invention, there is provided a ferroelectric memory device comprising: a memory cell including a switching transistor and a capacitor having a dielectric film of a ferroelectric substance for supplying electric charge corresponding to a data logic level of "1" or "0" to a bit line, the electric charge producing a voltage level on the bit line; and a reference voltage generator supplying a reference voltage to another bit line for comparing the voltage level with the reference voltage in a read-out operation, and including dummy memory cells storing electric charge corresponding to the data logic level of "1" and electric charge corresponding to the data logic level of "0", respectively, the reference voltage generator supplying the total of the electric charge corresponding to the data logic level of "1" and the electric charge corresponding to the data logic level of "0" to the another bit line to which a capacitance equivalent to two bit lines is coupled.

In accordance with another aspect of the present invention, there is provided a non-volatile ferroelectric memory device comprising: a plurality of addressable memory cells each including a series combination of a first switching transistor and a storage capacitor for storing a data bit in one of first and second logic levels, the storage capacitor having a dielectric film of ferroelectric substance sandwiched between a first electrode and a second electrode so as to change a polarization status depending upon a potential between the first and second electrodes along a hysteresis loop; a plurality of bit line pairs selectively associated with the plurality of addressable memory cells, each of the plurality of bit line pairs including a first bit line and a second bit line to which input and output nodes of the first switching transistors of associated addressable memory cells are selectively connected; a plurality of plate lines selectively associated with the plurality of addressable memory cells, each of the plurality of plate lines being connected to the second electrodes of the storage capacitors of associated addressable memory cells; a plurality of word lines selectively connected to control nodes of the first switching transistors of the plurality of addressable memory cells, and selectively driven to an active level so that the first switching transistors of the associated addressable memory cells turn on for electrically connecting the first electrodes of the storage capacitors to the first bit lines or the second bit lines, the data bit in the first logic level stored in the storage capacitor of one of the plurality of memory cells supplying a large amount of electric charge from the first electrode through the associated first switching transistor to the first bit line of the associated bit line pair for generating a first potential level on the first bit line, the data bit in the second logic level stored in the storage capacitor of the one of the plurality of memory cells supplying a small amount of electric charge from the first electrode through the associated first switching transistor to the first bit line of the associated bit line pair for generating a second potential level on the first bit line; a reference voltage generator including a plurality of reference voltage sub-generators selectively associated with the plurality of bit line pairs, one of the plurality of reference voltage sub-generators including a first dummy memory cell implemented by a series combination of a second switching transistor and a first dummy storage capacitor having a dielectric film of the ferroelectric substance sandwiched between third and fourth electrodes and storing a first dummy bit of the first logic level, a second dummy memory cell implemented by a series combination of a third switching transistor and a second dummy storage capacitor having a dielectric film of the ferroelectric substance sandwiched between fifth and sixth electrodes and storing a second dummy bit of the second logic level, and a capacitive means electrically connectable to the first dummy memory cell and the second dummy memory cell and having a capacitance approximately equal to a parasitic capacitance coupled to the second bit line, the first dummy storage capacitor and the second dummy storage capacitor supplying the total of the large amount of electric charge and the small amount of electric charge to the second bit line and the capacitive means so as to regulate the second bit line to a reference voltage level between the first potential level and the second potential level; and a plurality of sense amplifiers selectively connected to the plurality of bit line pairs, each of the plurality of sense amplifiers magnifying a potential difference between the first bit line and the second bit line of one of the plurality of bit line pairs.

In accordance with yet another aspect of the present invention, there is provided a method of reading out a data bit from a memory cell for storing a data bit in a ferroelectric capacitor in the form of polarization status, comprising the steps of: a) equalizing a first bit line with a second bit line paired with the first bit line; b) selecting at least one memory cell for supplying first electric charge representative of a data bit of logic "1" level or second electric charge representative of a data bit of logic "0" level to the first bit line for producing a first potential level representative of the data bit of logic "1" level or a second potential level representative of the data bit of logic "0" level on the first bit line; c) supplying the first electric charge representative of a first dummy data bit and the second electric charge representative of a second dummy data bit from a first dummy ferroelectric capacitor and a second dummy ferroelectric capacitor to a capacitive means having a capacitance twice as large as a parasitic capacitance coupled to the second bit line for producing a reference voltage at an intermediate point between the first potential level and the second potential level on the second bit line; d) magnifying a potential difference between the first bit line and the second bit line for quickly discriminating the logic level of the data bit read out to the first bit line; and e) restoring the data bit, the first dummy data bit and the second dummy data bit to the at least one memory cell, the first dummy ferroelectric capacitor and the second dummy ferroelectric capacitor, respectively.

BRIEF DESCRIPTION OF THE DRAWINGS

The features and advantages of the non-volatile ferroelectric memory device and the method of reading out a data bit therefrom according to the present invention will be more clearly understood from the following description taken in conjunction with the accompanying drawings in which.

DESCRIPTION OF THE PREFERRED EMBODIMENTS

First Embodiment

Figure 10:
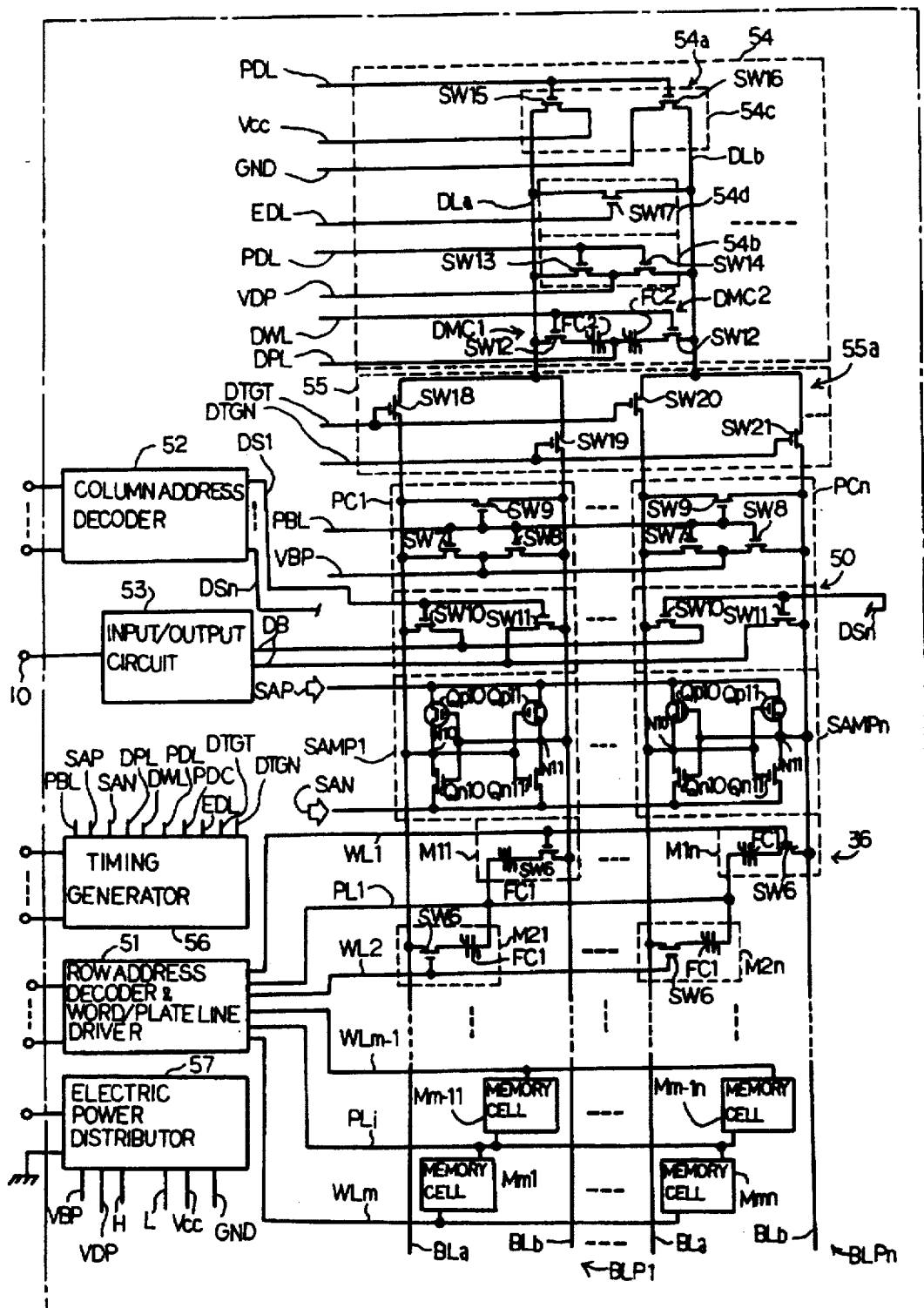
FIG. 10 is a circuit diagram showing circuit arrangement of a non-volatile ferroelectric memory device according to the present invention.

Referring to FIG. 10 of the drawings, a non-volatile ferroelectric memory device embodying the present invention is fabricated on a semiconductor chip 35.

The non-volatile ferroelectric memory device comprises a memory cell array 36. A plurality of memory cells M11–M1n, M21–M2n, Mm-11–Mm-1n and Mm1–Mmn form the memory cell array 36, and are arranged in rows and columns. Each of the memory cells M11 to Mmn includes an n-channel enhancement type switching transistor SW6 and a ferroelectric capacitor FC1 coupled in series, and the ferroelectric capacitor FC1 has a first electrode coupled to the source node of the n-channel enhancement type switching transistor SW6 and a second electrode opposite through a dielectric film to the first electrode. The dielectric film is formed of ferroelectric substance such as, for example, lead zircon titanate, and the polarization status is changed along a hysteresis loop depending upon a potential difference applied between the first electrode and the second electrode.

Two kinds of polarization status are representative of two logic levels of a data bit, respectively. When the ferroelectric capacitor FC1 of a memory cell is in the first kind of polarization status representative of logic "1" level, the ferroelectric capacitor FC1 discharges a large amount of electric charge therefrom under an appropriate bias condition. On the other hand, if a ferroelectric capacitor FC1 is in the second kind of polarization status representative of logic "0" level, a small amount of electric charge is discharged from the ferroelectric capacitor FC1 under the same bias condition.

The non-volatile ferroelectric memory device further comprises a plurality of word lines WL1, WL2, WLm-1 and WLm, a plurality of plate lines PL1 to PLi and a plurality of bit line pairs BLP1 to BLPn.

The plurality of word lines WL1 to WLm are respectively associated with the rows of memory cells M11-M1n, M21-M2n, . . . , Mm-11-Mm-1n and Mm1-Mmn, and are coupled to the gate electrodes of the n-channel enhancement type switching transistors SW6 of the associated rows of memory cells M11-M1n, M21-M2n, . . . , Mm-11-Mm-1n and Mm1-Mmn.

Each of the plurality of plate lines PL1 to PLi is shared between two rows of memory cells M11-M1n/M21-M2n, . . . or Mm-11-Mm-1n/Mm1-Mmn, and is coupled to the second electrodes of the ferroelectric capacitors FC1 of the associated rows of memory cells.

Each of the plurality of bit line pairs has a first bit line BLa and a second bit line BLb, and is associated with one of the columns of memory cells M11, M21, . . . , Mm-11 and Mmn, . . . or M1n, M2n, . . . , Mm-1n and Mmn. The drain nodes of the n-channel enhancement type switching transistors SW6 of each column of memory cells M11, M21, . . . , Mm-11 and Mmn, . . . or M1n, M2n, . . . , Mm-1n and Mmn are alternately connected to the first bit line BLa and the second bit line BLb of the associated pair.

The non-volatile ferroelectric memory device further comprises a plurality of precharge/balancing circuits PC1 to PCn respectively associated with the bit line pairs BLP1 to BLPn. Each of the precharge/balancing circuits PC1 to PCn includes n-channel enhancement type switching transistors SW7/SW8 coupled between the first and second bit lines BLa/BLb and a precharge line VBP and another n-channel enhancement type switching transistor SW9 coupled between the first bit line BLa and the second bit line BLb. In this instance, the precharge line VBP supplies the ground level to the precharge/balancing circuits PC1 to PCn, and the n-channel enhancement type switching transistors SW7 to SW9 are concurrently gated by a precharge control line PBL.

While the non-volatile ferroelectric memory device is standing idle, the precharge control signal PBL remains in an active high level, and the bit line pairs BLP1 to BLPn are discharged to the ground level through the n-channel enhancement type switching transistors SW7 to SW9. On the other hand, when a request for data access takes place, the precharge control signal PBL is changed to an inactive low level, and the n-channel enhancement type switching transistors SW7 to SW9 turn off. As a result, the first bit lines BLa and the second bit lines BLb are electrically isolated from the precharge line VBP and from each other.

The non-volatile ferroelectric memory device further comprises a plurality of sense amplifiers SAMP1 to SAMPn respectively associated with the bit line pairs BLP1 to BLPn. The sense amplifiers SAMP1 to SAMPn are powered by high and low power signals SAP and SAN at an appropriate timing so as to magnify potential difference between the first bit lines BLa and the second bit lines BLb.

As described hereinbefore, the ferroelectric capacitor FC1 supplies either large or small amount of electric charge through the n-channel enhancement type switching transistor SW6 to the bit line BLa or BLb, and the electric charge changes the potential level on the associated bit line BLa or BLb. The other bit line BLb or BLa is supplied with a reference voltage Vref as will be described hereinlater, and a small potential difference takes place between the bit lines BLa and BLb of the associated bit line pair. The sense amplifiers SAMP1 to SAMPn are expected to magnify these potential differences on the bit line pairs BLP1 to BLPn.

Each of the sense amplifiers SAMP1 to SAMPn is implemented by two series combinations of p-channel enhancement type field effect transistors Qp10/Qp11 and n-channel enhancement type field effect transistors Qn10/Qn11. The two series combinations Qp10/Qp11 and Qn10/Qn11 are coupled in parallel between signal lines assigned to the high and low power signals SAP and SAN, and common drain nodes N10 and N11 are connected to the gate electrodes of the series combination Qp11/Qn11 and the gate electrodes of the other series combination Qp10/Qn10. The common drain nodes N10 and N11 are further connected to the first and second bit lines BLa and BLb of the associated bit line pair, and the potential difference on the bit line pair complementarily drives the two series combinations Qp10/Qn10 and Qp11/Qn11. As a result, the high and low power signals SAP and SAN are respectively supplied to the common drain nodes N10 and N11 or vice versa, and the small potential difference is magnified to the large potential difference between the high level SAP and the low level SAN.

The non-volatile ferroelectric memory device further comprises a column selector 50 coupled between the bit line pairs BLP1 to BLPn and a data bus DB. The column selector 50 includes a plurality of pairs of n-channel enhancement type switching transistors SW10/SW11 respectively coupled to the bit line pairs BLP1 to BLPn. The n-channel enhancement type switching transistors SW10 and the n-channel enhancement type switching transistors SW11 are coupled between the first and second bit lines BLa/BLb and the data bus DB, and the pairs of n-channel enhancement type switching transistors SW10/SW11 are respectively gated by column address decoded signal lines DS1 to DSn. When one of the column address decoded signal lines DS1 to DSn is changed to the active high level, one of the pairs of n-channel enhancement type switching transistors SW10/SW11 turns on so as to electrically connect the associated bit line pair to the data bus DB.

The non-volatile ferroelectric memory device further comprises a row address decoder/word line and plate line driver 51, a column address decoder 52 and an input/output circuit 53.

The row address decoder/word line and plate line driver 51 is connected to the word lines WL1 to WLm and the plate lines PL1 to PLi, and is responsive to a row address signal for selectively driving the word lines WL1-W1m and the plate lines PL1-PLi to the active high level. Although a selected word line and a selected plate line change the respective potential levels at different timings, internal timing control signals may give the different timings to the row address decoder/word line and plate line driver 51.

On the other hand, the column address decoder 52 is connected to the column address decoded signal lines DS1 to DSn, and is responsive to a column address signal so as to selectively drive the column address decoded signal lines DS1 to DSn to the active high level.

The input and output circuit 53 is connected to the data bus DB, and is communicable with an external device through an input/output data pin IO. When the column selector 50 connects one of the bit line pairs BLP1 to BLPn to the data bus DB, the input and output circuit 53 is electrically connected to the selected bit line pair, and a potential difference representative of a read-out data bit or a write-in data bit is transferred between the input and output circuit 53 and the selected bit line pair.

The non-volatile ferroelectric memory device further comprises a reference voltage generator 54, and the reference voltage generator 54 supplies the reference voltage Vref to the bit lines BLb or BLa opposite to the bit lines BLa or BLb supplied with the electric charge packets from the ferroelectric capacitors FC1. When the large amount of electric charge representative of logic "1" level is supplied from a ferroelectric capacitor FC1 to a bit line BLa/BLb, the large amount of electric charge lifts the bit line BLa/BLb to a first potential level. On the other hand, when the small amount of electric charge representative of logic "0" level is supplied from a ferroelectric capacitor FC1 to a bit line BLa/BLb, the small amount of electric charge lifts the bit line BLa/Blb to a second potential level. The reference voltage level Vref is regulated to a mid point between the first potential level and the second potential level.

The reference voltage generator 54 includes a plurality of reference voltage sub-generators 54a each shared between two of the bit line pairs BLP1 to BLPn. Although the reference voltage sub-generator 54a shown in FIG. 10 is provided for the bit line pairs BLP1 and PLBn, each reference voltage sub-generator 54a would be shared between adjacent two bit line pairs in an actual memory device.

The reference voltage sub-generator 54a includes first and second dummy memory cells DMC1 and DMC2 coupled between conductive lines DLa and DLb, a dummy precharging circuit 54b coupled to the conductive lines DLa and DLb, a data write-in circuit 54c also coupled to the conductive lines DLa and DLb and an equalizing circuit 54d coupled between the conductive lines DLa and DLb. The conductive lines DLa/DLb are much shorter than the associated first and second bit lines BLa/BLb, and, accordingly, parasitic capacitance coupled to the conductive lines DLa/DLb is ignoreable with respect to the parasitic capacitance coupled to each bit line pair BLP1 or BLPn.

An n-channel enhancement type switching transistor SW12 and a ferroelectric capacitor FC2 are coupled in series, and form each of the first and second dummy memory cells DMC1/DMC2. The ferroelectric capacitor FC2 is identical with the ferroelectric capacitor FC1, and the ferroelectric capacitors FC1 and FC2 are equal in dimensions to one another. The dummy memory cells DMC1/DMC2 may be concurrently fabricated together with the memory cells M11 to Mmn.

The ferroelectric capacitor FC2 of the dummy memory cell DMC1 has third and fourth electrodes opposed through a dielectric film to each other, and the third electrode is electrically connectable to the conductive line DLa. On the other hand, the ferroelectric capacitor FC2 of the other dummy memory cell DMC2 has fifth and sixth electrodes opposed through a dielectric film to each other, ad the fifth electrode is electrically connectable to the other conductive line DLb. The fourth and sixth electrodes are connected to a dummy plate line DPL, and the n-channel enhancement type switching transistors SW12 are concurrently gated by a dummy word line DWL.

The dielectric films of the ferroelectric capacitors FC2 are formed of the ferroelectric substance, and each dielectric film changes the polarization status along the hysteresis loop depending upon the potential difference between the third and fourth electrodes or the fifth and sixth electrodes. For this reason, if a dummy data bit of logic "1" level is stored in each dummy memory cell DMC1/DMC2, the ferroelectric capacitor FC2 supplies the large amount of electric charge to the conductive line DLa/DLb. On the other hand, if each dummy memory cell DMC1/DMC2 stores a dummy data bit of logic "0" level, the ferroelectric capacitor FC2 supplies the small amount of electric charge to the conductive line DLa/DLb.

The precharging circuit 54b has n-channel enhancement type switching transistors SW13 and SW14 coupled between the conductive lines DLa/DLb and a dummy precharge line VDP fixed to the ground level. The n-channel enhancement type switching transistors SW13 and SW14 are concurrently gated by a dummy precharge control signal PDL, and grounds the conductive lines DLa/DLb therethrough.

The data write-in circuit 54c has two n-channel enhancement type switching transistors SW15/SW16. The n-channel enhancement type switching transistor SW15 is coupled between a positive power voltage line Vcc and the conductive line DLa, and the other n-channel enhancement type switching transistor SW16 is coupled between a ground line GND and the other conductive line DLb. The n-channel enhancement type switching transistors SW15/SW16 are concurrently gated by a write-in control signal PDC.

A dummy data bit of logic "1" level and a dummy data bit of logic "0" level are represented by the high level or the positive power voltage Vcc and the low level or the ground level, respectively, as similar to the data bit of logic "1" level and the data bit of logic "0" level stored in the memory cells M11 to Mmn, and these dummy data bits are written into the dummy memory cells DMC1 and DMC2 in the presence of the write-in control signal PDC of the active high level.

The equalizing circuit 54d is implemented by an n-channel enhancement type switching transistor SW17 coupled between the conductive lines DLa and DLb, and is gated by a balance control signal EDL. While the balance control signal EDL is in the active high level, the n-channel enhancement type switching transistor SW17 is turned on, and the conductive line DLa is electrically connected through the n-channel enhancement type switching transistor SW17 to the other conductive line DLb.

The non-volatile ferroelectric memory device further comprises a transfer gate circuit 55. The transfer gate circuit 55 includes a plurality of transfer gate sub-circuits 55a connected between one of the reference voltage sub-generators 54a and the associated two bit line pairs.

Each of the transfer gate sub-circuits 55a has two pairs of n-channel enhancement type switching transistors SW18/SW19 and SW20/SW21. The n-channel enhancement type switching transistors SW18/SW19 are coupled between the conductive line DLa and the first and second bit lines BLa/BLb of one of the associated bit line pairs, and the n-channel enhancement type switching transistors SW20/SW21 are coupled between the other conductive line DLb and the first and second bit lines BLa/BLb of the other bit line pair.

The n-channel enhancement type switching transistors SW18 and SW20 are concurrently gated by a gate control signal DTGT, and the other n-channel enhancement type switching transistors SW19 and SW21 are concurrently gated by another gate control signal DTGN.

One of the gate control signals DTGT and DTGN is changed to the active high level depending upon the word line driven to the active high level. For example, if the word line WL1 is driven to the active high level, the memory cells M11 to M1n lift the second bit lines BLb to the first/second potential levels depending upon the data bits stored therein. In this situation, the gate control signal DTGT is changed to the active high level so as to supply the reference voltage Vref to the first bit lines BLa. As a result, the bit line pairs BLP1 to BLPn have respective potential differences between the first potential level and the reference voltage Vref and/or between the second potential level and the reference voltage level Vref.

The non-volatile ferroelectric memory device further comprises a timing generator 56 and an electric power distributor 57. The timing generator 56 changes the control signals PBL, SAP, SAN, DPL, DWL, PDL, PDC, EDL, DTGT and DTGN between the active level and the inactive level at respective timings, and the electric power distributor 57 constantly supplies the potential levels VBP, VDP, H, L, Vcc and GND to the circuits as described hereinbefore.

Description is hereinbelow made on an access to a data bit stored in the memory cell M1n with reference to FIG. 11. The memory cell M1n is assumed to store a data bit of logic "1" level. Although the data access affects the other memory cells in the same row before the column selector 50 couples the bit line pair BLPn to the data bus DB, the description is focused on the memory cell M1n and the associated bit line pair BLPn, only, and ignores the other memory cells coupled and the other bit line pairs for the sake of simplicity. This means that the description also ignores the reference voltage sub-generators associated with the other bit line pairs.

The precharge control signal PBL and the dummy precharge control signal PDL were in the active high level before phase 1, and the precharge/balancing circuit PCn and the dummy precharge circuit 54b have discharged the bit line pair BLPn and the conductive lines DLa/DLb to the ground level. The dummy data bit of logic "1" level and the dummy data bit of logic "0" level have been already written into the first dummy memory cell DMC1 and the second dummy memory cell DMC2.

The precharge control signal PBL and the dummy precharge control signal PDL start to go down to the inactive low level at time t11, and the n-channel enhancement type switching transistors SW7–SW9 and the n-channel enhancement type switching transistors SW13 and SW14 turn off so as to electrically isolate the bit line pair BLPn and the conductive lines DLa/DLb from the precharge line VBP and the dummy precharge line VDP. The balance control signal EDL stays at the active high level in phase 1, and the conductive lines DLa and DLb are still electrically connected to each other.

The gate control signal DTGN starts to go down to the inactive low level at time t12, and causes the n-channel enhancement type switching transistors SW19 and Sw21 to turn off so as to electrically isolate the second bit lines BLb from the conductive lines DLa/DLb, respectively.

The word line WL1 and the dummy word line DWL start to rise at time t13, and cause the n-channel enhancement type switching transistor SW6 of the memory cell M1n and the n-channel enhancement type switching transistors SW12 to turn on. The ferroelectric capacitor FC1 of the memory cell M1n is electrically connected to the second bit line BLb of the pair BLPn, and the ferroelectric capacitors FC2 of the first and second dummy memory cells DMC1/DMC2 are electrically connected to the conductive lines DLa/DLb, respectively.

The plate line PL1 and the dummy plate line DPL start to rise at time t14, and bias the ferroelectric capacitor FC1 of the memory cell M1n and the ferroelectric capacitors FC2 of the first and second dummy memory cells DMC1/DMC2. As a result, the large amount of electric charge representative of logic "1" level is supplied from the ferroelectric capacitor FC1 to the second bit line BLb, and the second bit line BLb of the bit line pair BLPn is lifted to the first potential level. On the other hand, the large amount of electric charge representative of logic "1" level and the small amount of electric charge representative of logic "0" level are supplied from the ferroelectric capacitors FC2 to the conductive lines DLa/DLb, respectively, and the total of the large amount of electric charge and the small amount of electric charges are accumulated in the parasitic capacitors respectively coupled to the conductive lines DLa/DLb and the parasitic capacitors respectively coupled to the first bit lines BLa, because the balance control signal EDL and the gate control signal DTGT at the active high level cause the n-channel enhancement type switching transistors SW17 and SW18/SW20 to electrically connect the conductive lines DLa/DLb and the first bit lines BLa to one another.

The potential level Vbla1 and Vblan on the first bit lines BLa are given by equation 4.

$$Vbla1=Vblan=(Q0+Q1)/(Cbla1+Cblan+Cdla+Cdlb) \quad (4)$$

where Q0 is the small amount of electric charge, Q1 is the large amount of electric charge, Cbla1 is the parasitic capacitance coupled to the first bit line BLa of the bit line pair BLP1, Cblan is the parasitic capacitance coupled to the first bit line BLa of the bit line pair BLPn, Cdla is the parasitic capacitance coupled to the conductive line DLa and Cdlb is the parasitic capacitance coupled to the conductive line DLb.

As described hereinbefore, the conductive lines DLa/DLb are much shorter than the bit lines BLa/BLb, and the parasitic capacitances Cdla and Cdlb are ignoreable. The first bit lines BLa are equal in length and width to each other, and the parasitic capacitance Cbla1 is equal to the parasitic capacitance Cblan. These relations are expressed as follows.

$$Cbla1=Cblan=Cb \quad (5)$$

$$Cdla=Cdlb=Cd \quad (6)$$

$$Cd \ll Cb \quad (7)$$

Substitute the above relations for the parasitic capacitances in equation 4, we obtain equation 8.

$$Vbla1=Vblan=(Q0+Q1)/(2\times Cb) \quad (8)$$

Equation 8 teaches that the reference voltage Vref, i.e., Vblan is exactly adjusted to the mid point between the first potential level and the second potential level. Thus, a small potential difference takes place between the first and second bit lines BLa and BLb of the bit line pair BLPn.

Even if the fabrication process fluctuates, the fluctuation evenly affects the ferroelectric capacitors FC1 and FC2, and the first potential level, the second potential level and the reference voltage level Vref are moved in parallel. For this reason, the reference voltage Vref is still adjusted to the mid point between the first potential level and the second potential level.

The balance control signal EDL starts to go down to the inactive low level at time t15, and causes the n-channel enhancement type switching transistor SW17 to turn off so as to electrically isolate the conductive lines DLa and DLb from each other. The gate control signal DTGT starts to go down to the inactive low level at time t16, and causes the n-channel enhancement type switching transistors SW18/ SW20 to turn off so as to electrically isolate the first bit lines BLa from the conductive lines DLa/DLb.

The high and low power signals SAP/SAN start to change the potential levels to the high level and the low level, and activates the sense amplifier SAMPn. The sense amplifier SAMPn magnifies the potential difference on the bit line pair BLPn, and the first bit line BLa and the second bit line BLb reach the high level and the low level, respectively.

The write-in control signal PDC also starts to rise at time t17, and causes the n-channel enhancement type switching transistors SW15 and SW16 to turn on. The conductive lines DLa and DLb are respectively connected to the positive power voltage line Vcc and the ground line GND, and the conductive lines DLa/DLb are separated to the positive power voltage level Vcc and the ground level GND. The dummy word line DWL still remains at the high level, and the dummy data bit of logic "1" level and the dummy data bit of logic "0" level are restored in the first dummy memory cell DMC1 and the second dummy memory cell DMC2, respectively. In this instance, the dummy data bits are restored in the first and second dummy memory cells DMC1 and DMC2 in phase 5; however, there is no problem in so far as the dummy data bits are restored before the next data access.

Figure 11:
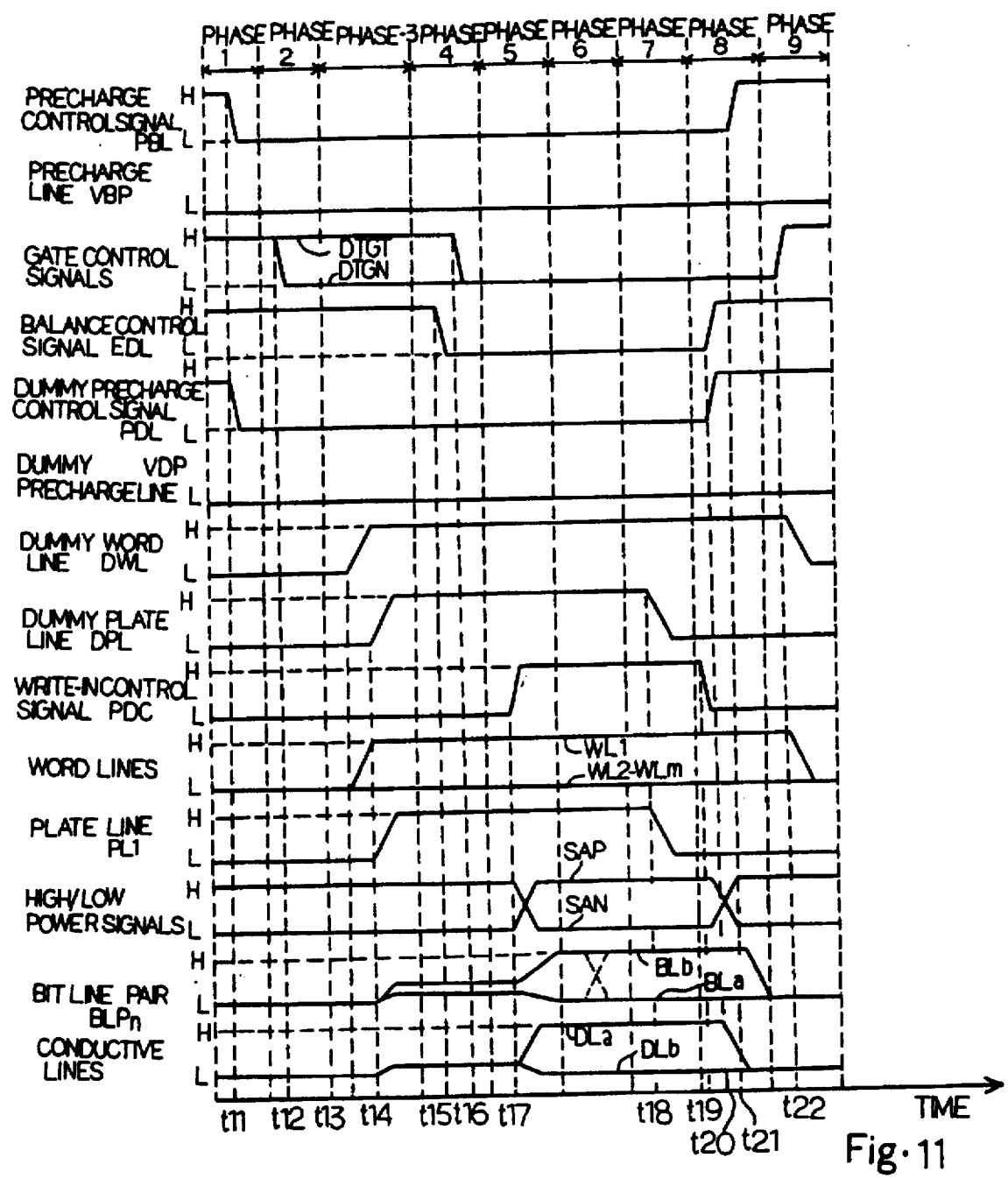
FIG. 11 is a timing chart showing a data access to a memory cell incorporated into the non-volatile ferroelectric memory device.

Though not shown in FIG. 11, the column address decoder 52 changes the column address decoded signal line DSn to the active high level, and the potential difference on the bit line pair BLPn is transferred through the n-channel enhancement type switching transistors SW10/SW11 to the data bus DB. The data bus DB propagates the potential difference to the input/output circuit 53, and the input/output circuit 53 produces an output data signal from the potential difference.

If a new data bit is supplied to the input/output circuit 53 in the presence of a write enable signal, the input/output circuit 53 produces a potential difference representative of the new data bit on the data bus DB, and is transferred to the bit line pair BLPn in phase 6.

The plate line PL1 and the dummy plate line DPL start to go down to the inactive low level at time t18. The high and low power signals SAP and SAN start to make the respective potential levels inactive at time t19, and the sense amplifier SAMPn does not respond to a potential difference on the bit line pair BLPn. The write-in control signal PDC also starts to change the potential level to inactive low, and the conductive lines Dla/DLb are electrically isolated from the power voltage lines Vcc and GND.

The balance control signal EDL and the dummy precharge control signal PDL start to rise toward the active high level at time t20, and cause the n-channel enhancement type switching transistor SW17 and the n-channel enhancement type switching transistors SW13/SW14 to turn on. The n-channel enhancement type switching transistors SW17 and Sw13/SW14 discharge the conductive lines DLa/DLb to the ground level.

The precharge control signal PBL starts to rise at time t21, and causes the n-channel enhancement type switching transistors SW7 to SW9 to turn on. The electric charge is discharged from the first bit line BLa through the n-channel enhancement type switching transistors SW7–SW9 to the precharge line VBP, and the first and second bit lines BLa/BLb are balanced at the ground level.

Finally, the gate control signals DTGT and DTGN start to rise to the active high level at time t22, and the word line WL1 and the dummy word line DWL concurrently start to decay. The gate control signals DTGT and DTGN cause the n-channel enhancement type switching transistors SW18 to SW21 to turn on, and the conductive lines DLa/DLb are electrically connected to the associated bit line pairs. The word line WL1 and the dummy word line DWL cause the n-channel enhancement type switching transistor SW6 of the memory cell M1n and the n-channel enhancement type switching transistors SW12 of the first and second dummy memory cells DMC1/DMC2 to turn off, and the ferroelectric capacitors FC1 and the ferroelectric capacitors FC2 are electrically isolated from the second bit line BLb and the conductive lines DLa/DLb, respectively.

In this instance, the first bit line of the bit line pair BLP1 serves as a capacitive means so that the parasitic capacitance coupled to the ferroelectric capacitors FC2 is twice larger than the parasitic capacitance coupled to the ferroelectric capacitor FC1.

As will be understood from the foregoing description, the dummy data bit of logic "1" level and the dummy data bit of logic "0" produce the reference voltage Vref exactly adjusted to the mid point between the first and second potential levels, and the reference voltage Vref is free from the fluctuation of the fabrication process.

Second Embodiment

Figure 5:
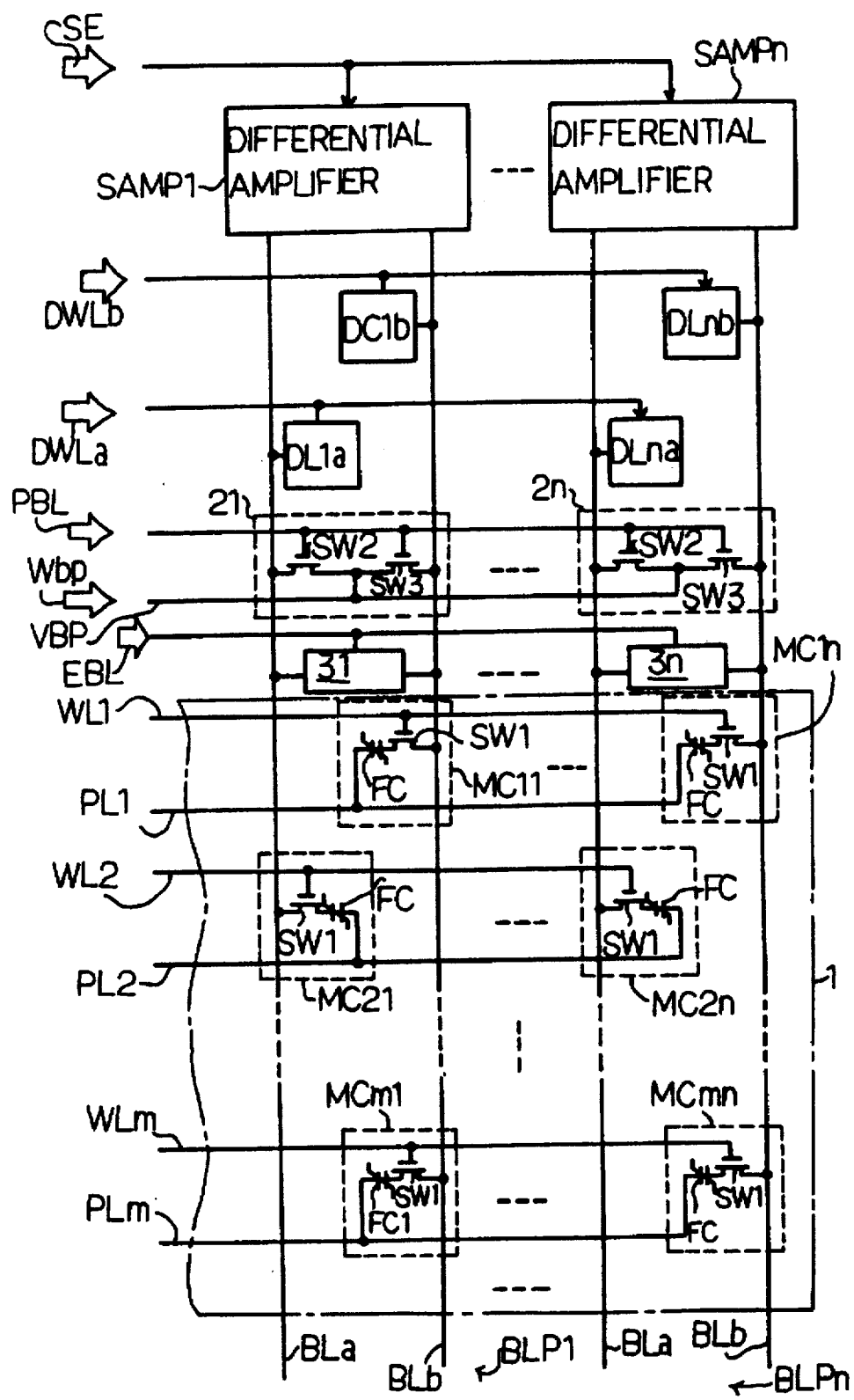
FIG. 5 is a circuit diagram showing the circuit arrangement of another prior art non-volatile ferroelectric memory device.
Figure 6:
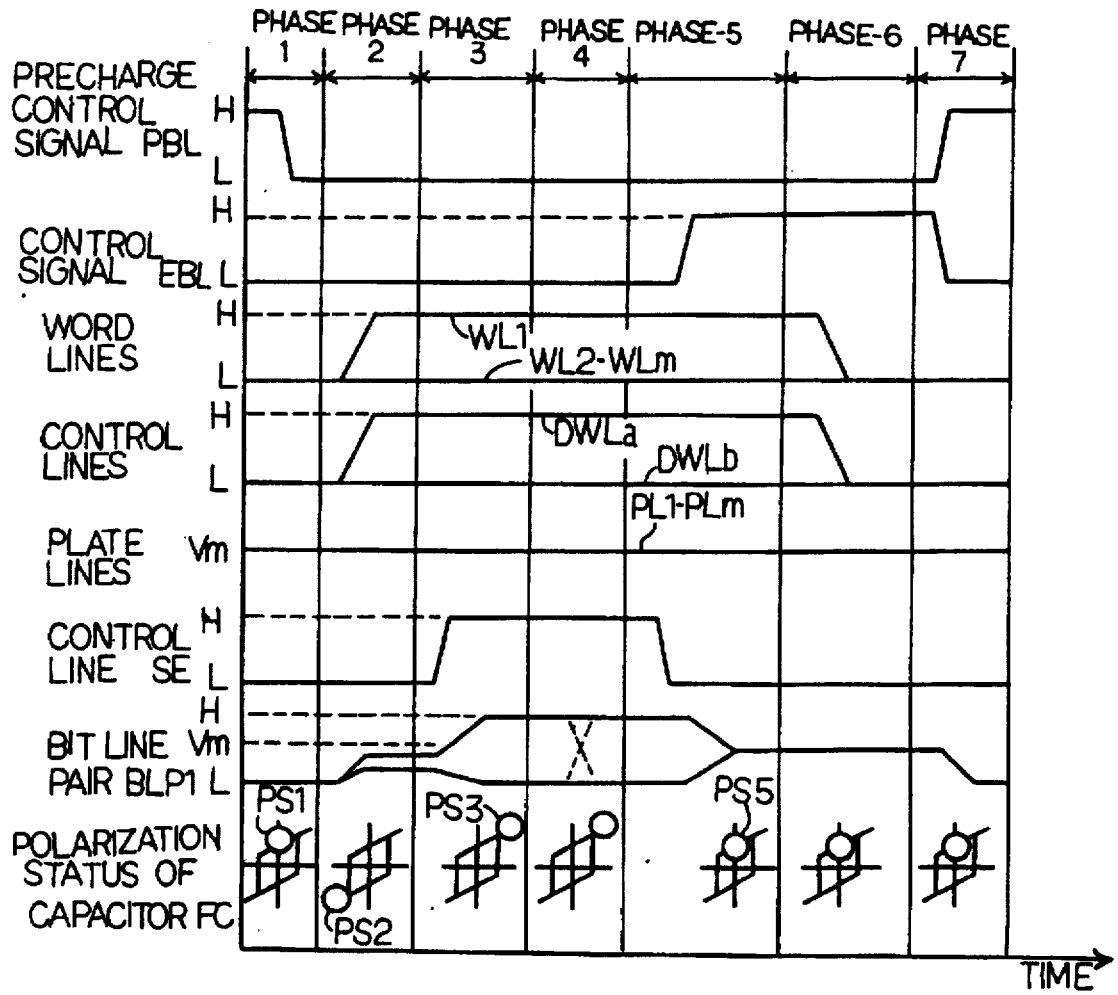
FIG. 6 is a timing chart, showing the read-out of a data bit from the memory cell of the prior art non-volatile ferroelectric memory device shown in FIG. 5.
Figure 7:
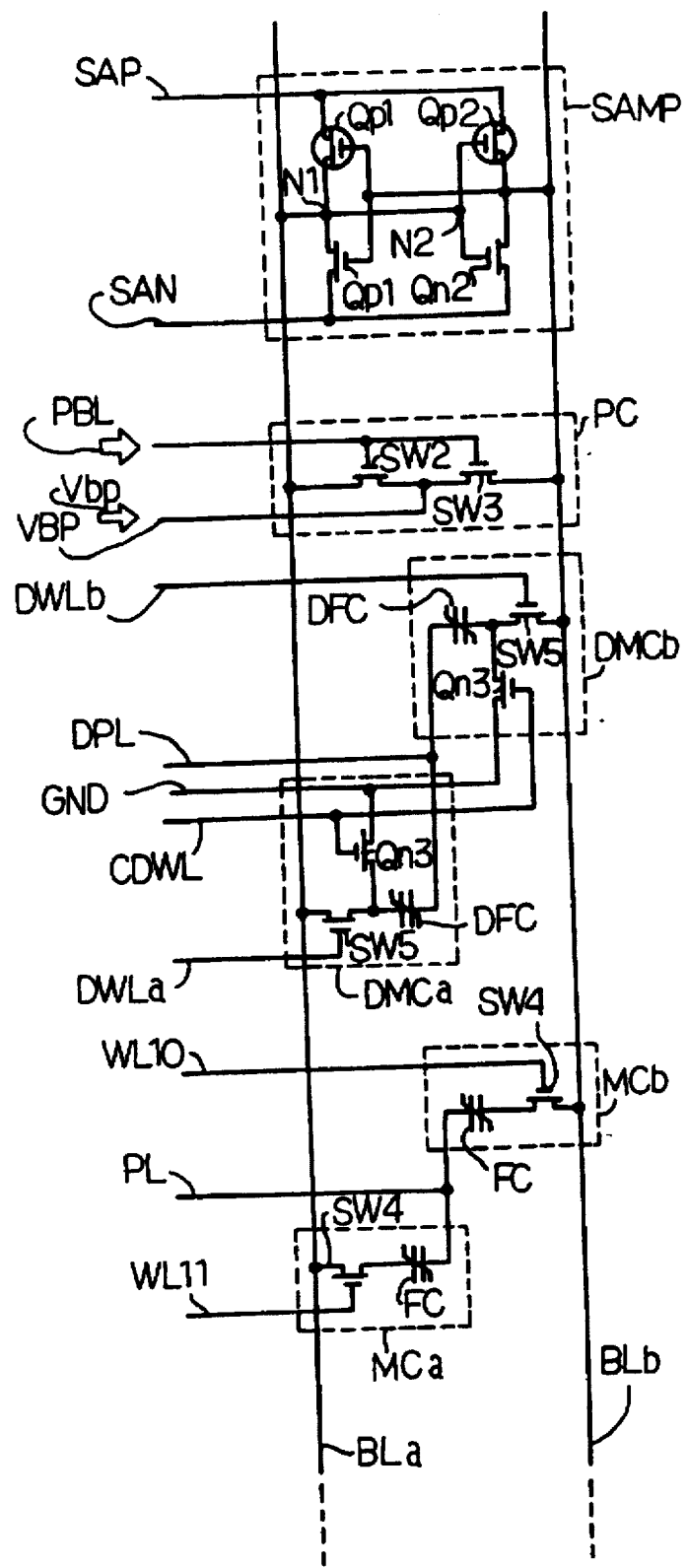
FIG. 7 is a circuit diagram showing the circuit arrangement of the prior art reference voltage generator disclosed in 1994 ISSCC together with other components of the prior art non-volatile ferroelectric memory device.
Figure 8:
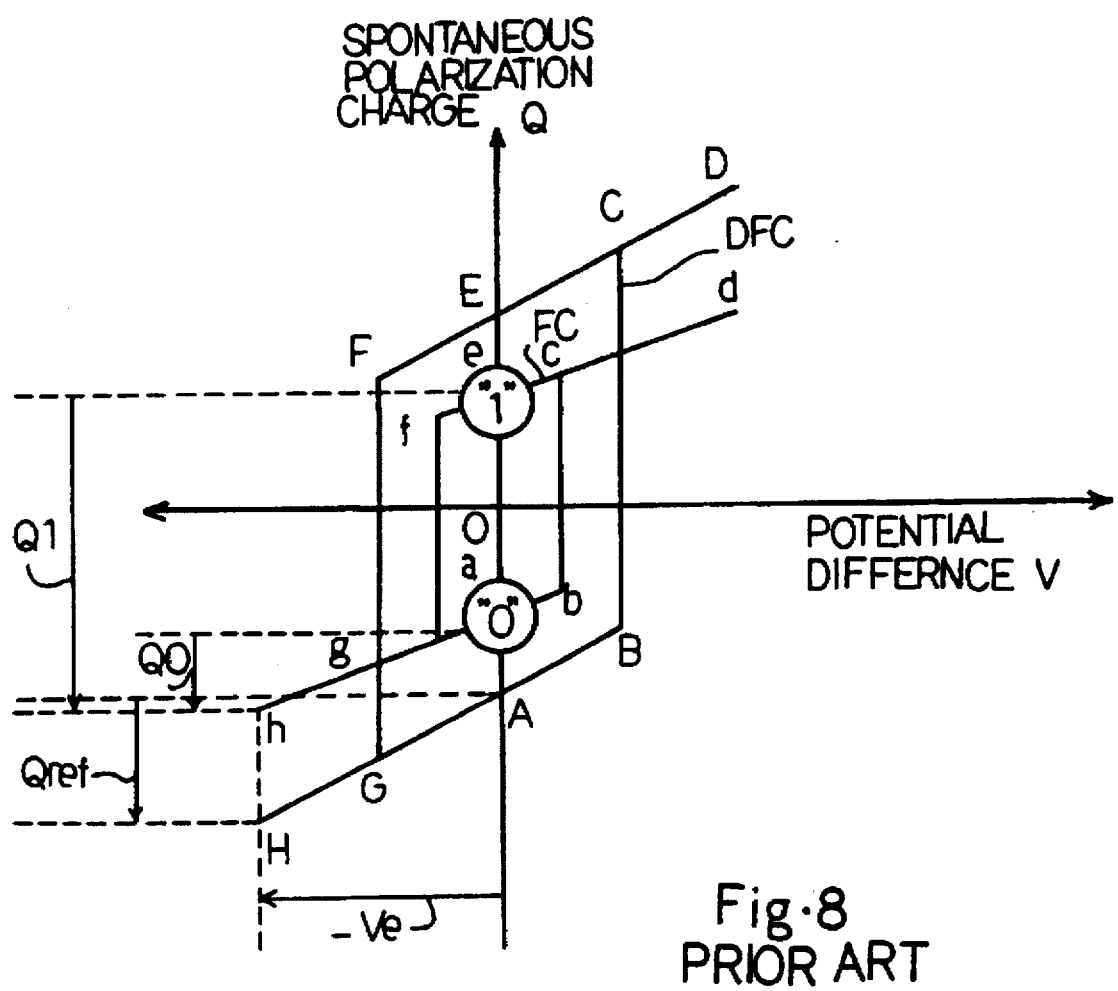
FIG. 8 is a diagram showing the charge-to-voltage characteristics of the ferroelectric capacitor and the dummy ferroelectric capacitor.
Figure 9:
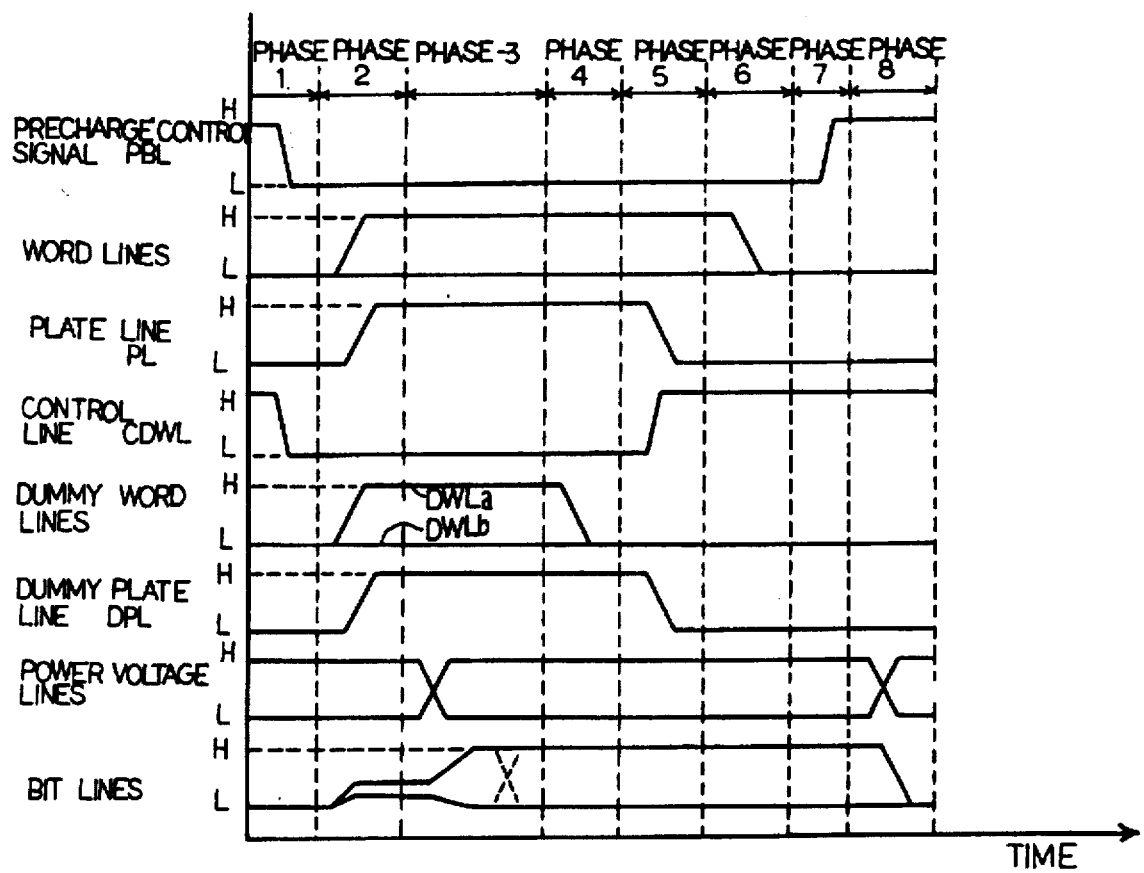
FIG. 9 is a timing chart showing the circuit behavior of the prior art non-volatile ferroelectric memory device equipped with the prior art reference voltage generators.
Figure 12:
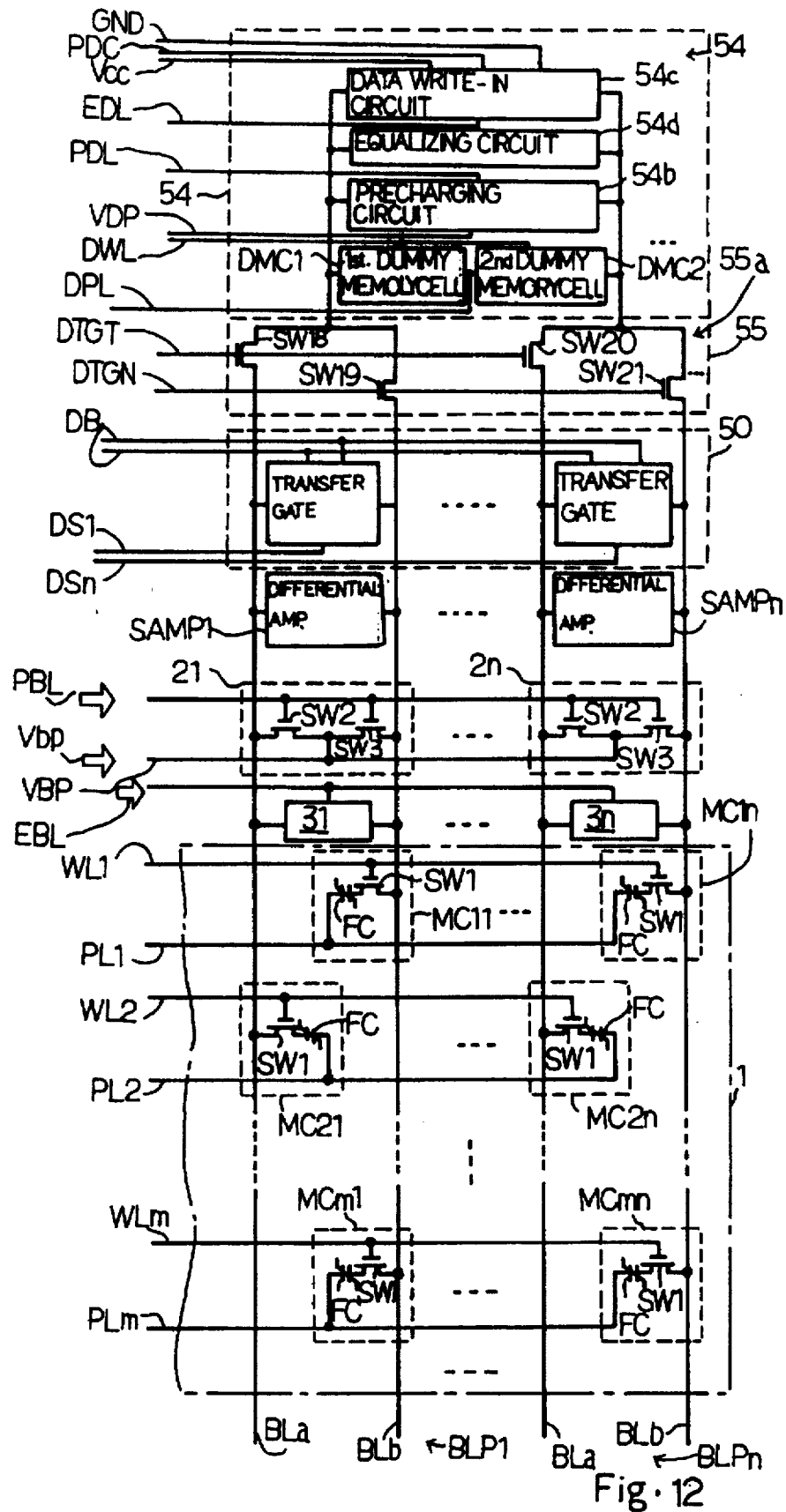
FIG. 12 is a circuit diagram showing the circuit arrangement of another non-volatile ferroelectric memory device according to the present invention.

Turning to FIG. 12 of the drawings, another non-volatile ferroelectric memory device embodying the present invention is a compromise between the prior art non-volatile ferroelectric memory device shown in FIG. 5 and the first embodiment. For this reason, the control signals, the memory cells and the other circuits shown in FIG. 12 are labeled with reference signs designating corresponding signals, memory cells and circuits shown in FIGS. 5 and 10 without detailed description for the sake of simplicity. Though not shown, the electric power distributor further generates an intermediate voltage Vm between the high level H and the low level L, and distributes the intermediate voltage Vm to the precharge line VBP, the dummy plate line DPL, the plate lines Pl1–Plm and the timing generator.

Figure 13:
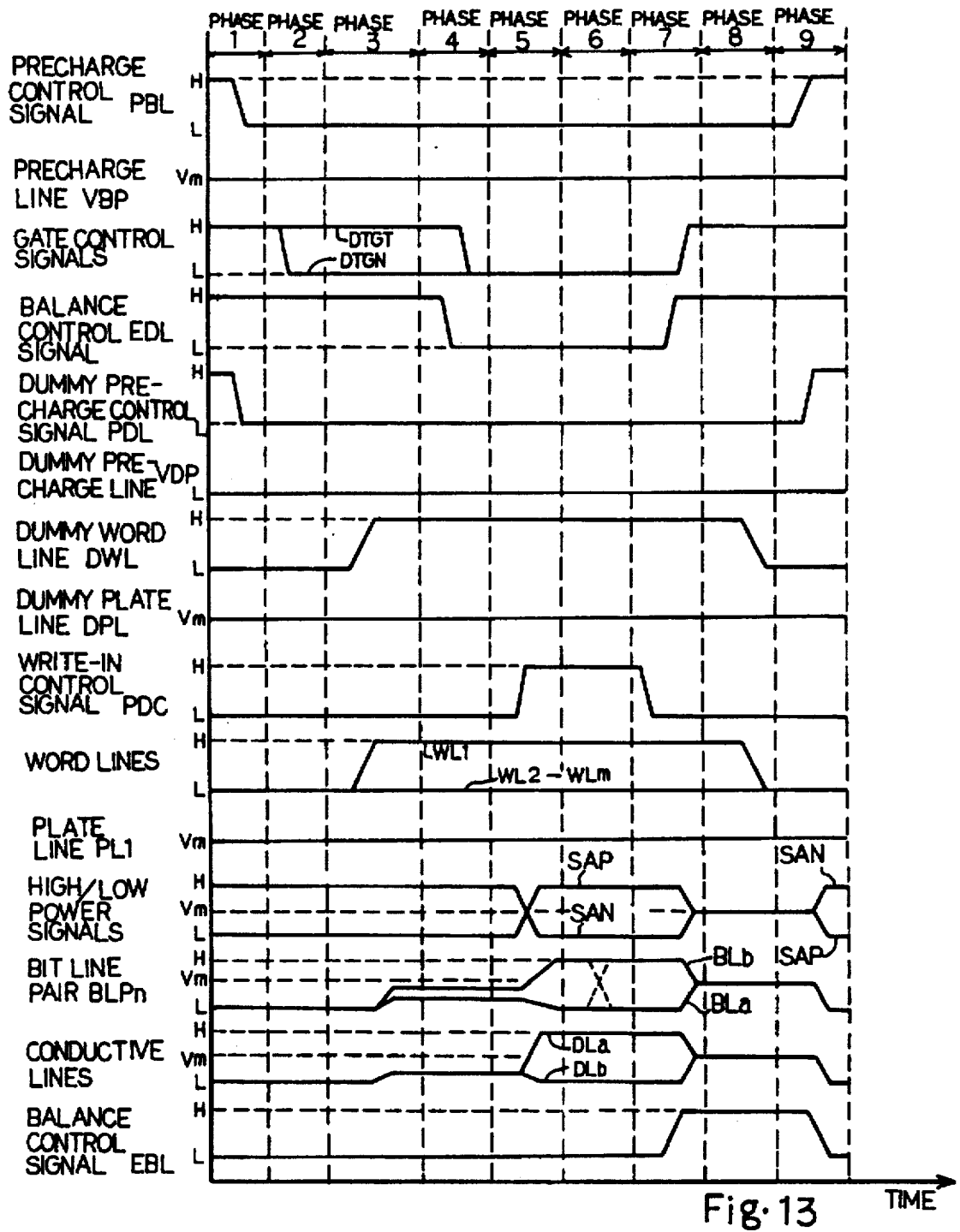
FIG. 13 is a timing chart showing a data access to a memory cell incorporated into the non-volatile ferroelectric memory device shown in FIG. 12.

FIG. 13 illustrates a data access to the memory cell MC1n where a data bit of logic "1" level is stored. Description is also focused on the memory cell MC1n and the bit line pair BLPn. The bit line pair BLPn and the conductive lines Dla/DLb have already discharged to the ground level.

First, the dummy precharge control signal PDL and the precharge control signal PBL are decayed to the low level in phase 1, and causes the precharging circuit 54b and the precharge/balancing circuits 21–2n to isolate the conductive lines DLa/DLb and the first bit line BLa from the dummy precharge line VDP and precharge line VBP.

After the isolation of the conductive lines DLa/DLb from the dummy precharge line VDP, the data access sequence proceeds to phase 2, and the gate control signal DTGN is decayed to the low level so as to isolate the second bit lines BLb from the conductive lines DLa/DLb. However, the other gate control signal DTGT remains at the high level, and the first bit lines BLa are still electrically connected to the conductive lines DLa/DLb.

The word line WL1 and the dummy word line DWL are lifted to the high level in phase 3. The word line WL1 at the high level causes the n-channel enhancement type switching transistor SW1 of the memory cell MC1n to turn on, and the second bit line BLb is electrically connected to the ferroelectric capacitor FC of the memory cell MC1n. As a result, the ferroelectric capacitor FC is biased to –Vm, and the large amount of electric charge is supplied from the ferroelectric capacitor FC to the second bit line BLb of the bit line pair BLPn. The large amount of electric charge increases the second bit line BLb to the first potential level. On the other hand, the dummy word line DWL at the high level causes the first and second dummy memory cells DMC1 and DMC2 to supply the large amount of electric charge and the small amount of electric charge to the conductive lines DLa/DLb. The large amount of electric charge is merged with the small amount of electric charge through the equalizing circuit 54d, and the total of the large amount of electric charge and the small amount of electric charge gives the reference voltage Vref through the n-channel enhancement type switching transistors SW18/SW20 to the first bit lines BLa. The reference voltage is exactly adjusted to the mid point between the first potential level representative of logic "1" level and the second potential level representative of logic "0" level.

Thereafter, the data access sequence proceeds through phases 4 to 6, and the behavior in phases 4 to 6 is similar to that of the first embodiment.

The write-in control signal PDC is recovered to the low level, and the conductive lines DLa/DLb are electrically isolated from the power voltage lines Vcc and the ground line GND. The balance control signal EBL, the balance control signal EDL and the gate control signals DTGT/DTGN are lifted to the high level in phase 7. The high and low power signals SAP/SAN are changed to the intermediate potential level Vm. The balance controlling circuits 31-3n change the first/second bit lines BLa/BLb of the bit line pairs BLPn—BLPn to the intermediate potential level Vm in the presence of the balance control signal EBL, and the gate control signals DTGT/DTGN cause the n-channel enhancement type switching transistors SW18 to SW21 to electrically connect the bit line pair BLPn to the conductive lines DLa/DLb. The balance control signal EDL at the high level causes the equalizing circuit 54d to balance the conductive lines DLa and DLb. As a result, the first and second bit lines BLa/BLb and the conductive lines DLa/DLb are regulated to the intermediate potential level Vm, and no bias is applied to the ferroelectric capacitors FC and FC2.

The balance control signal EBL rises to the high level in phase 8, and the balance control circuit 3n equalizes the first and second bit lines Bla/BLb. The word line WL1 and the dummy word line DWL are recovered to the low level in phase 8, and the bit line pairs BLPn and the conductive lines DLa/DLb are electrically isolated from the ferroelectric capacitor FC of the memory cell MC1n and the ferroelectric capacitors FC2 of the first and second dummy memory cells DMC1/DMC2.

Finally, the balance control signal EBL is recovered to the inactive low level in phase 9, and the dummy precharge control signal PDL is changed to the high level. Moreover, the high and low power signals SAP and SAN are changed to the inactive low level and the inactive high level, respectively, in phase 9. The precharge control signal PBL at the high level causes the precharging circuits 21-2n to connect the first and second bit lines BLa/BLb to the precharge line VBP. The dummy precharge control signal PDL at the high level causes the precharging circuit 54b to discharge the conductive lines DLa/DLb to the ground level, and the ground level is propagated through the n-channel enhancement type switching transistors SW18 to SW21 to the bit line pairs.

In this instance, the capacitive means is implemented by the first or second bit line BLa/BLb of a bit line pair paired with the bit line pair coupled to the accessed memory cell.

The balancing circuits 31 to 3n may be deleted from the non-volatile ferroelectric memory device shown in FIG. 12, because the first and second bit lines BLa/BLb are well balanced through the transfer gate circuit 55a and the balancing circuit 54d.

The non-volatile ferroelectric memory device implementing the second embodiment achieves all the advantages of the first embodiment.

Figure 14:
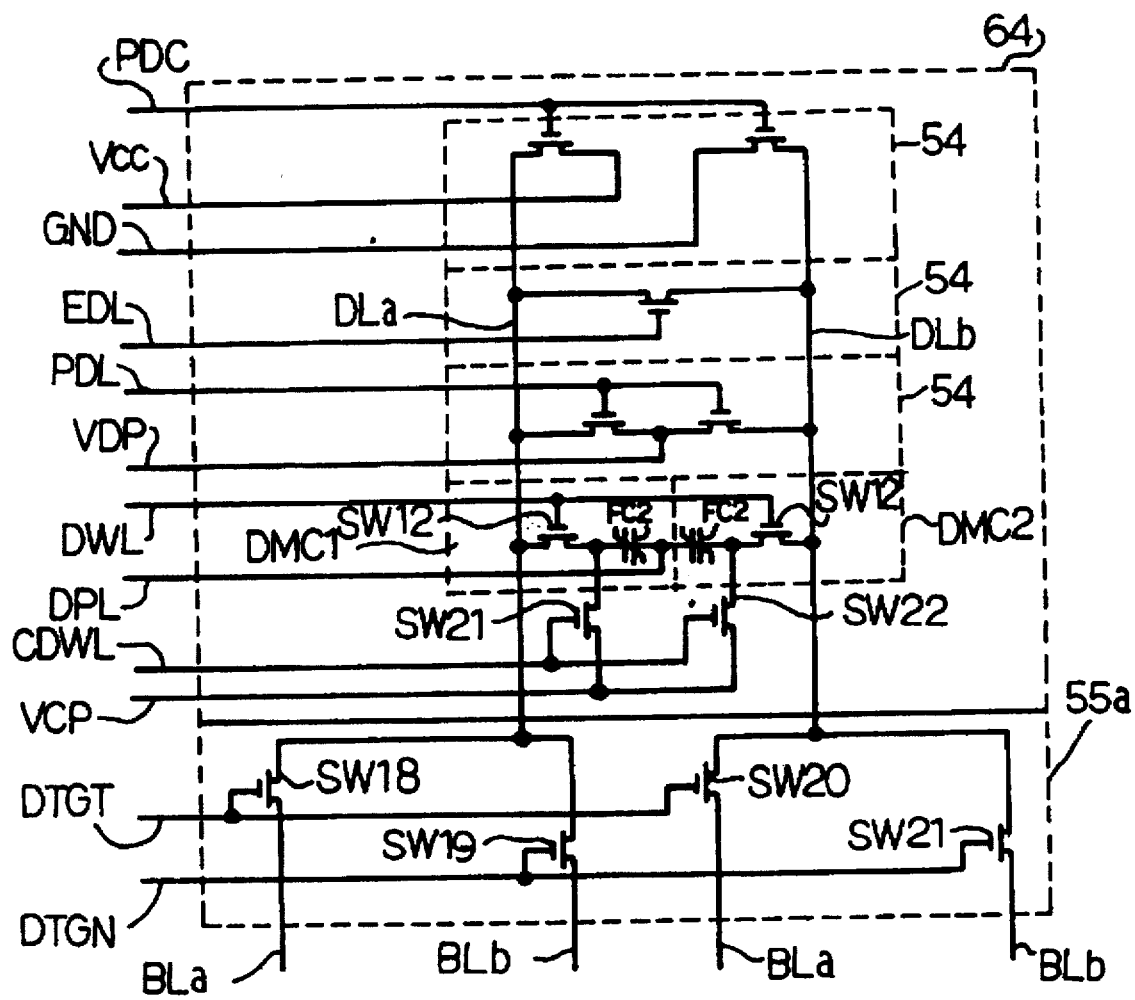
FIG. 14 is a circuit diagram showing a modification of a reference voltage generator incorporated in the non-volatile ferroelectric memory device shown in FIG. 12.

The non-volatile ferroelectric memory device implementing the second embodiment may be modified as shown in FIG. 14. Although the plate lines PL1 to PLm are maintained at the intermediate potential level Vm, it is necessary to remove a bias from the ferroelectric capacitors, and the bit line pairs BLP1 to BLPn and the conductive lines DLa/DLb are changed to the intermediate potential level Vm before the recovery of the word line/dummy word line. In order to perfectly remove the bias from the ferroelectric capacitors FC2, n-channel enhancement type switching transistors SW21 and SW22 are coupled between the source nodes of the n-channel enhancement type switching transistors SW12 and an intermediate potential line VCP. The n-channel enhancement type switching transistors SW21 and SW22 are gated by a compensation control line CDWL.

Figure 15:
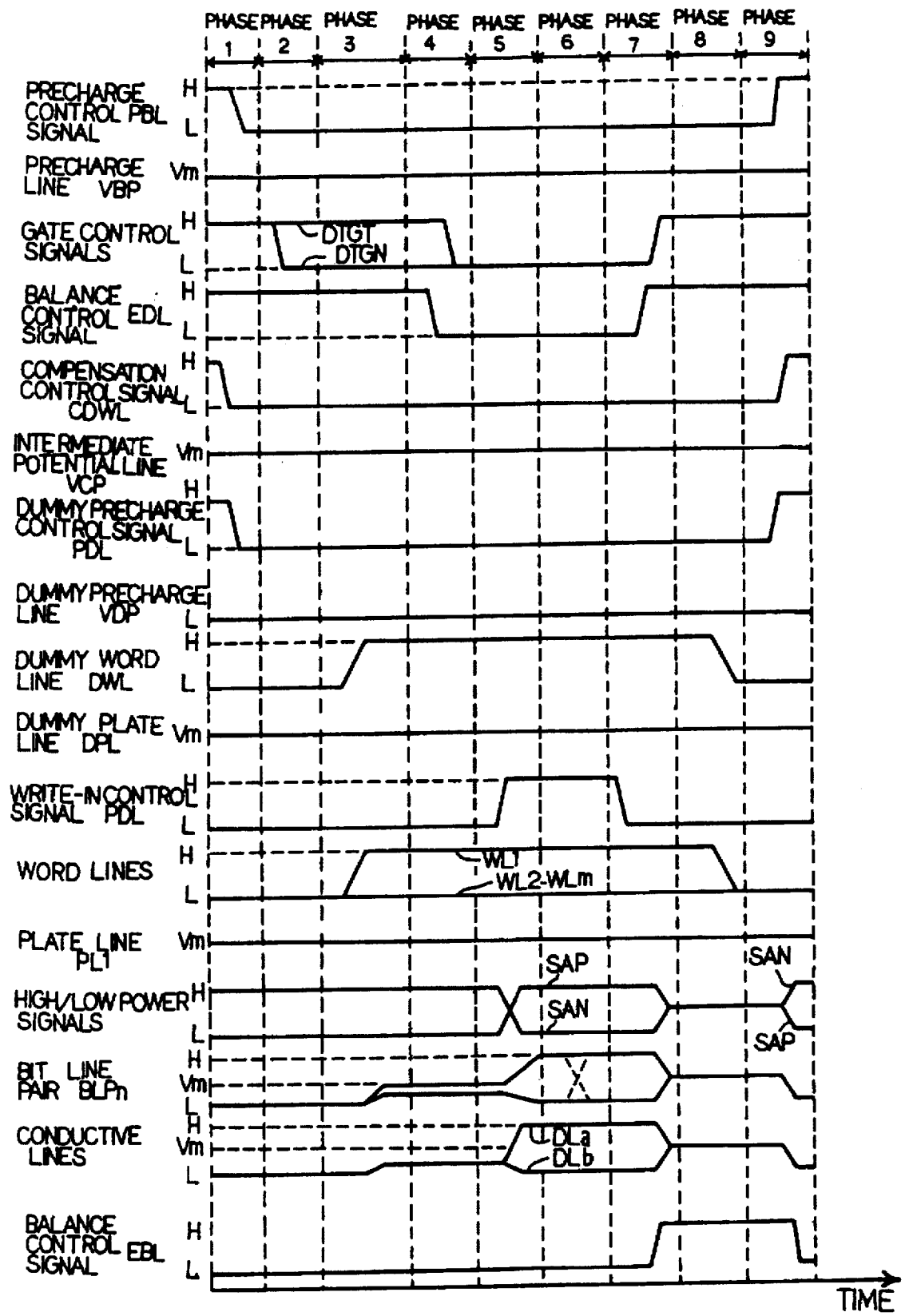
FIG. 15 is a timing chart showing a data access to a memory cell of yet another non-volatile ferroelectric memory device equipped with the reference voltage generator shown in FIG. 14.

FIG. 15 illustrates a data access to a memory cell incorporated in yet another non-volatile ferroelectric memory device equipped with the reference voltage generator 64 shown in FIG. 14. The data access sequence is similar to that of the second embodiment except for the bias compensation. For this reason, description is focused on the bias compensation only.

While the non-volatile ferroelectric memory device is standing idle, the compensation control signal CDWL is in the active high level, and the n-channel enhancement type switching transistors SW21/SW22 to supply the intermediate potential level Vm to the electrodes of the ferroelectric capacitors FC2 connected to the source nodes of the n-channel enhancement type switching transistors SW12. The dummy plate line DPL supplies the intermediate potential level Vm to the other electrodes of the ferroelectric capacitors FC2. Thus, the intermediate potential level Vm is supplied to both electrodes of each ferroelectric capacitor FC2, and, accordingly, no bias is applied across the dielectric film of the ferroelectric substance.

The compensation control line CDWL is recovered to the inactive low level in phase 1, and causes the n-channel enhancement type switching transistors SW21 and SW22 to turn off. The source nodes of the n-channel enhancement type switching transistors SW12 are electrically isolated from the intermediate potential line VCP, and the n-channel enhancement type switching transistors SW12 can propagate the large amount of electric charge and the small amount of electric charge to the conductive lines DLa/DLb.

The compensation control line CDWL rises to the active high level in phase 9. The word line and the dummy word lines have been already recovered to the inactive low level, and the ferroelectric capacitors FC2 are electrically isolated from the conductive lines DLa/DLb. The compensation control line CDWL at the high level causes the n-channel enhancement type switching transistors SW21 and SW22 to turn on, and the intermediate potential level Vm is supplied from the intermediate potential line VCP and the dummy plate line DPL to both electrodes of each ferroelectric capacitor FC2 so as to perfectly remove a bias.

Third Embodiment

Figure 16:
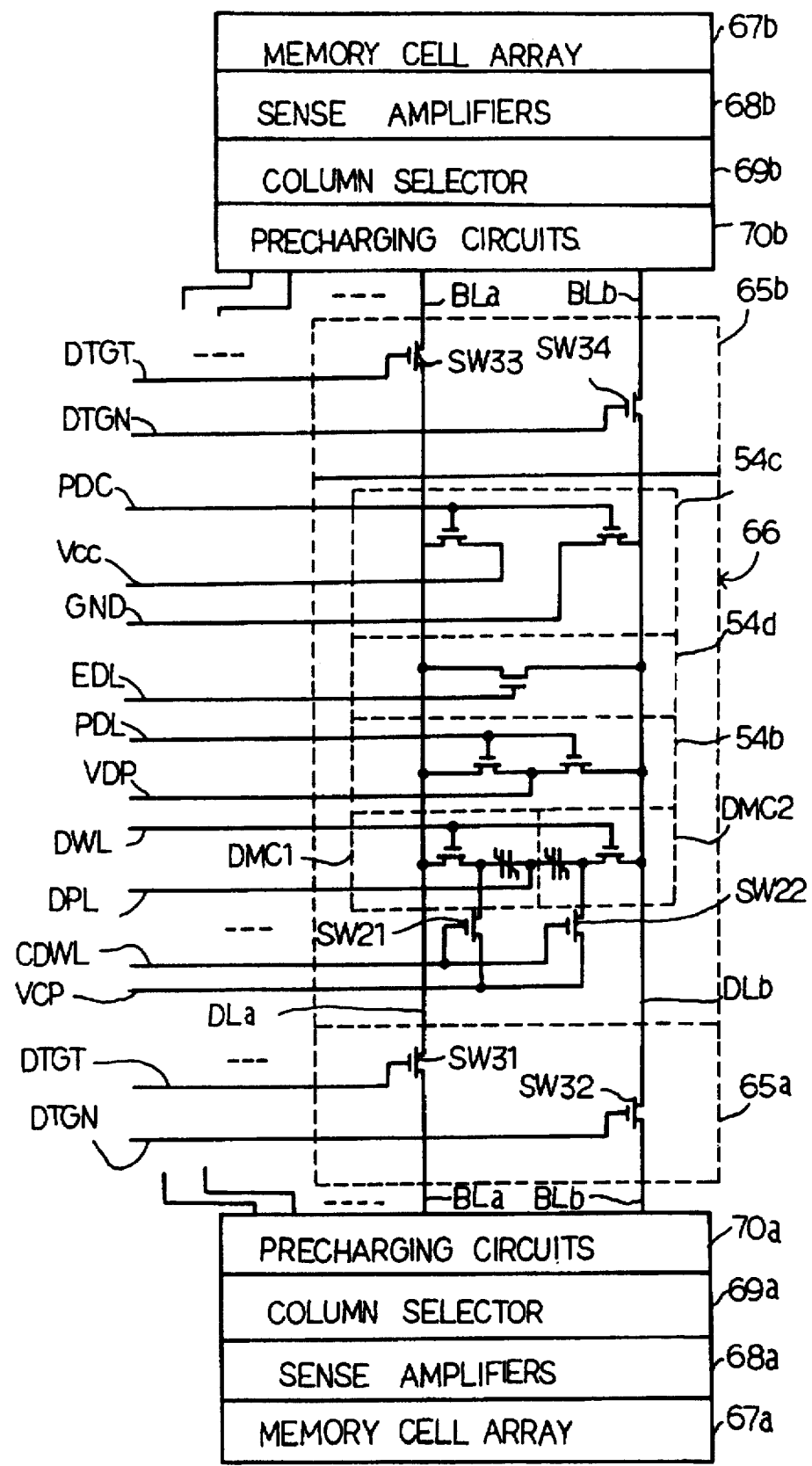
FIG. 16 is a circuit diagram showing the circuit arrangement of yet another non-volatile ferroelectric memory device according to the present invention.

FIG. 16 illustrates yet another non-volatile ferroelectric memory device. The non-volatile ferroelectric memory device shown in FIG. 16 is similar to the second embodiment except for a transfer gate circuit 65, a reference voltage generator 66, the balancing circuits 31 to 3n and the arrangement of dummy word lines DWL1–DWL4.

The reference voltage generator 66 is similar to the modification shown in FIG. 14, and transistors and signals of the reference voltage generator 66 are labeled with reference signs designating corresponding transistors and signals of the reference voltage generator 64. The balancing circuits 31 to 3n are deleted from the non-volatile ferroelectric memory device implementing the third embodiment. The reference voltage generator 66 is sandwiched between two transfer gate sub-circuits 65a and 65b, and the transfer gate sub-circuits 65a and 65b selectively connect the reference voltage generator 66 to a set of the memory cell array 67a, the sense amplifiers 68a, the column selector 69a and the precharging circuits 70a and another set of the memory cell array 67b, the sense amplifiers 68b, the column selector 69b and the precharging circuits 70b. The balance control sub-circuit 65a is implemented by a pair of n-channel enhancement type switching transistors SW31/SW32, and the n-channel enhancement type switching transistors SW31/SW32 are coupled between the conductive lines DLa/DLb and the first and second bit lines BLa/BLb, respectively. The balance control sub-circuit 65b is also implemented by a pair of n-channel enhancement type switching transistors SW33/SW34, and the n-channel enhancement type switching transistors SW33/SW34 are coupled between the conductive lines DLa/DLb and the first and second bit lines BLa/BLb, respectively.

The n-channel enhancement type switching transistors SW31 and SW33 are concurrently gated by a gate control signal DTGT, and the other n-channel enhancement type switching transistors SW32 and SW34 are concurrently gated by a gate control signal DTGN. One of the gate control signals DTGT and DTGN is changed to an active high level, and the reference voltage generator 66 is electrically connected to the two bit lines BLa or BLb.

Figure 17:
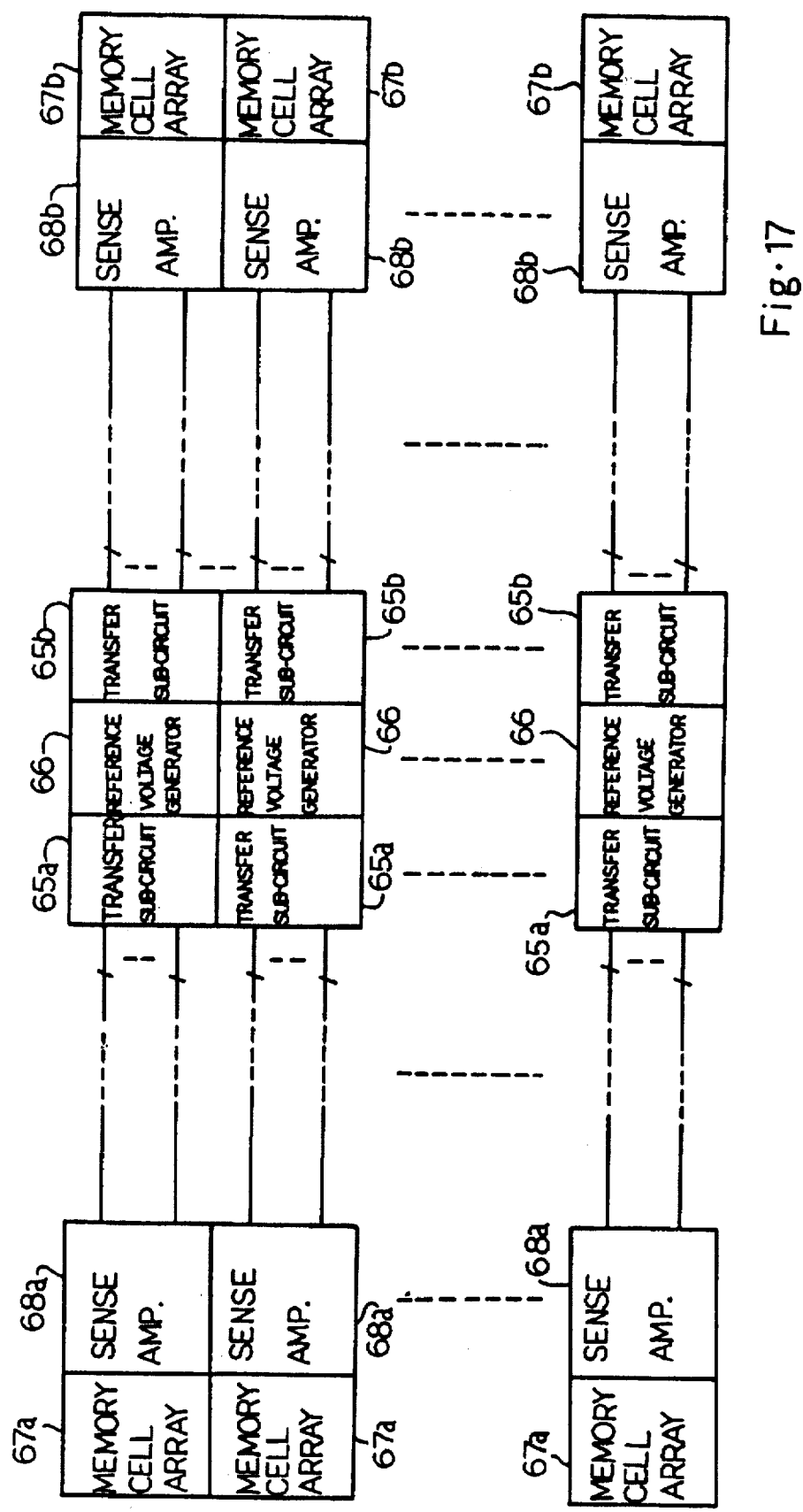
FIG. 17 is a block diagram showing the arrangement of a first modification of the non-volatile ferroelectric memory device shown in FIG. 16.
Figure 18:
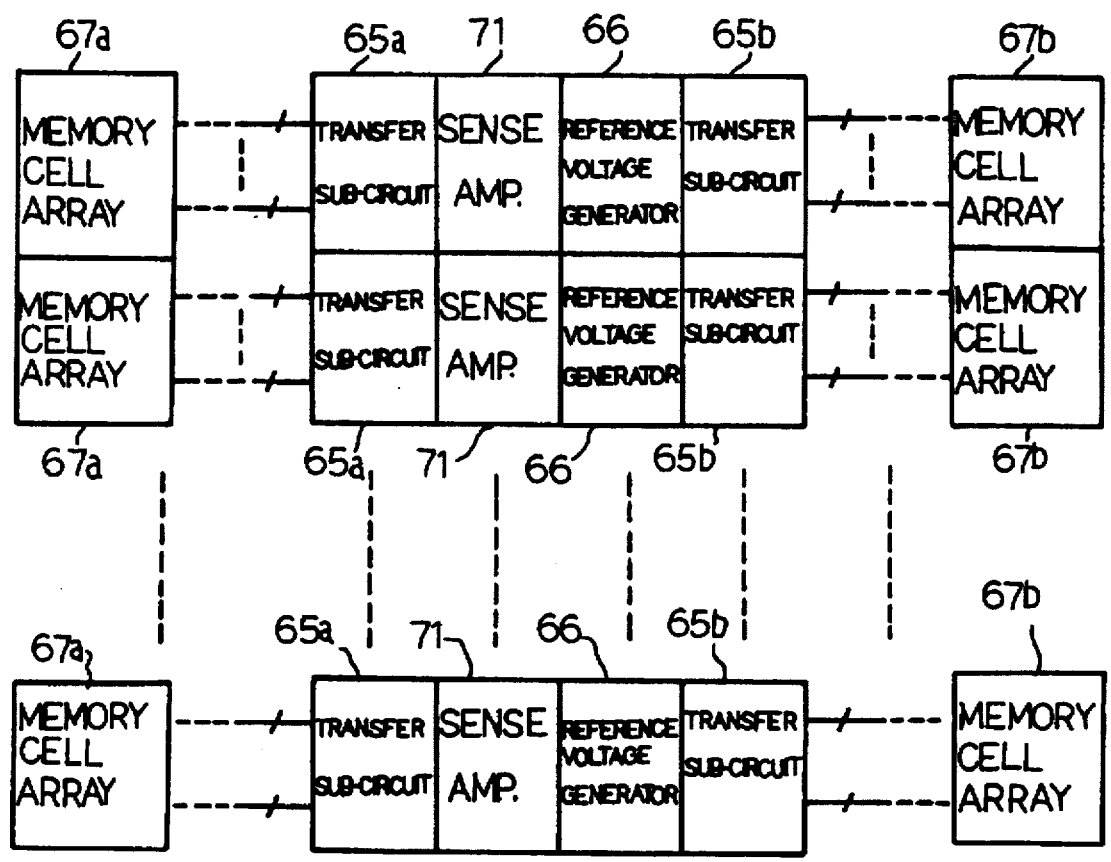
FIG. 18 is a block diagram showing the arrangement of a second modification of the non-volatile ferroelectric memory device shown in FIG. 16.

In this instance, when one of the memory cells of the array 67a is accessed, either first or second bit line BLa/BLb associated with the other memory cell array 67b serves as the capacitive means. The dummy word lines DWL1/DWL2 and DWL3/DWL4 are sequentially controlled to restore the data bits. The third embodiment achieves all the advantages of the first embodiment. The arrangement shown in FIG. 16 may be multiplied as shown in FIG. 17. The non-volatile ferroelectric memory device shown in FIG. 17 may be further modified as shown in FIG. 18. In this instance, the sense amplifiers 71 are shared between two memory cell arrays 67a and 67b, and the circuit arrangement and the signal control become simple.

Fourth Embodiment

Figure 19:
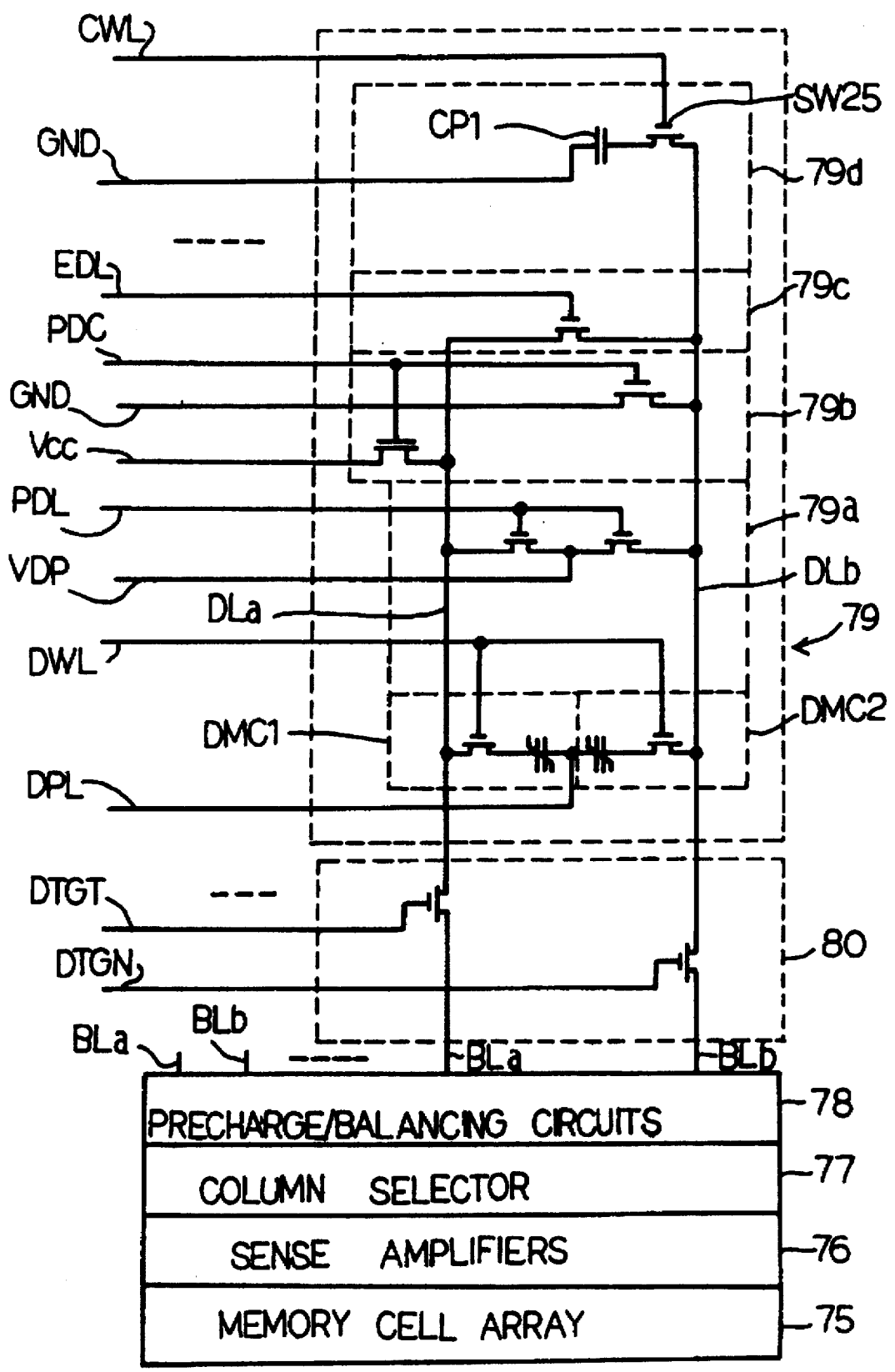
FIG. 19 is a circuit diagram showing the arrangement of still another non-volatile ferroelectric memory device according to the present invention.

Turning to FIG. 19 of the drawings, still another non-volatile ferroelectric memory device embodying the present invention comprises a memory cell array 75, sense amplifiers 76, a column selector 77, precharge/balancing circuits 78, a reference voltage generator 79 and a transfer gate circuit 80. The memory cell array 75, the sense amplifiers 76, the column selector 77 and the precharging circuits 78 are similar to those of the first embodiment, and no further description is incorporated hereinbelow.

The transfer gate circuit 80 is implemented by a pair of n-channel enhancement type switching transistors as similar to the transfer gate circuit 55a, and one of the gate control signals DTGT/DTGN causes the associated n-channel enhancement type switching transistor to couple the bit line BLa or BLb to conductive lines DLa/DLb.

The reference voltage generator 79 includes first and second dummy memory cells DMC1/DMC2 coupled in series between the conductive lines DLa/DLb, a precharging circuit 79a responsive to the dummy precharge control signal PDL for discharging the conductive lines DLa/DLb to the ground level, a write-in circuit 79b responsive to the write-in control signal PDC for supplying the positive power voltage Vcc and the ground level to the conductive lines DLa/DLb, respectively, an equalizing circuit 79c responsive to the balance control signal EDL for electrically connecting the conductive lines DLa/DLb to each other and a reference voltage regulator 79d coupled to the conductive line DLb. The first and second dummy memory cells DMC1/DMC2, the precharging circuit 79a, the write-in circuit 79b and the equalizing circuit 79c are similar to those of the reference voltage generator 54a, and the reference voltage regulator 79d is newly added to the conductive line DLb. For this reason, description is made on the reference voltage regulator 79d, only.

The reference voltage regulator 79d includes a capacitor CP1 and an n-channel enhancement type switching transistor SW25 coupled between a ground voltage line GND and the conductive line DLb, and the n-channel enhancement type switching transistor SW25 is gated by a gate control signal CWL. The capacitance of the capacitor CP1 is selected in such a manner that the total capacitance of the capacitor CP1 and the conductive lines DLa/DLb is equal to the bit line BLa or BLb. When the large amount of electric charge and the small amount of electric charge are supplied from the first and second dummy memory cells DMC1/DMC2 to the conductive lines DLa/DLb, the gate control signal CWL is changed to the active high level, and causes the n-channel enhancement type switching transistor SW25 to turn on. As a result, the n-channel enhancement type switching transistor SW25 allows the electric charge to flow into the capacitor CP1. The total of the large amount of electric charge and the small amount of electric charge is shared between the capacitor CP1, the parasitic capacitor coupled to the conductive lines DLa/DLb and the parasitic capacitor coupled to one of the first and second bit lines BLa/BLb, and the potential level on the conductive lines Dla/DLb and the bit line BLa/BLb coupled to the selected memory cell is exactly regulated to the mid point between the first potential level and the second potential level.

In this instance, the capacitor CP1 and the parasitic capacitor coupled to the conductive lines DLa/DLb form in combination the capacitive means.

The non-volatile ferroelectric memory device implementing the fourth embodiment achieves all the advantages described in connection with the first embodiment.

Figure 20:
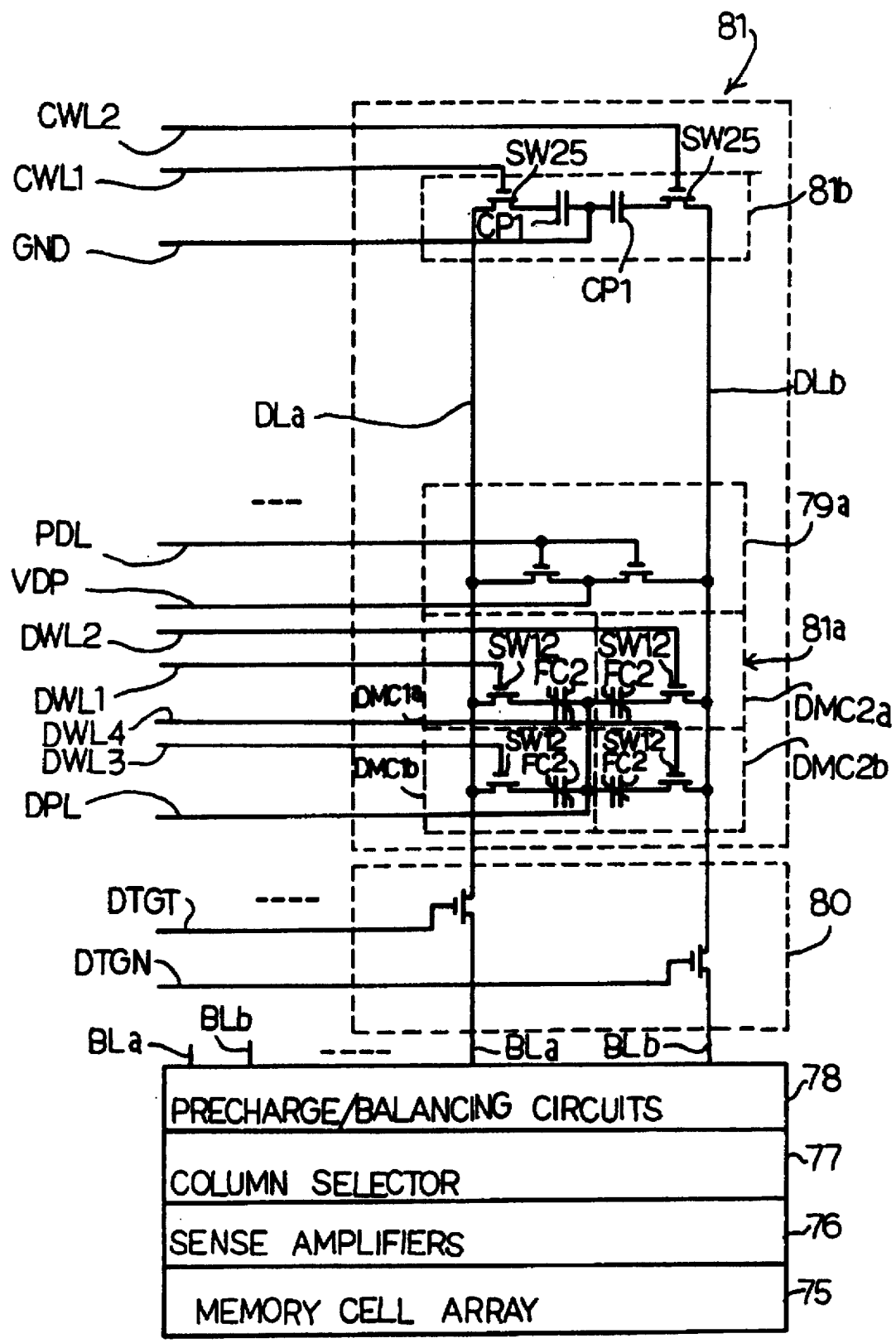
FIG. 20 is a circuit diagram showing the arrangement of a modification of the non-volatile ferroelectric memory device shown in FIG. 19.

The reference voltage generator 79 may be modified as shown in FIG. 20. The reference voltage generator 81 includes two pairs of dummy memory cells DMC1a/DMC1b and DMC2a/DMC2b, and the equalizing circuit 79c is deleted from the reference voltage generator 81.

The n-channel enhancement type switching transistor SW12 and the ferroelectric capacitor FC2 form each of the dummy memory cells DMC1a/DMC1b and DMC2a/DMC2b, and the two pairs of dummy memory cells DMC1a/DMC1b and DMC2a/DMC2b are respectively coupled to the conductive lines DLa and DLb. The dummy memory cells DMC1a and DMC1b store the dummy data bit of logic "7" level and the dummy data bit of logic "0" level, respectively, and are gated by a dummy word line DWL1. The other dummy memory cells DMC2a and DMC2b store the dummy data bit of logic "1" level and the dummy data bit of logic "0" level, respectively, and are gated by a dummy word line DWL2.

The dummy word lines DWL1 and DWL2 are selectively changed to the active high level, and the dummy memory cells DMC1a/DMC1b or DMC2a/DMC2b supply the large amount of electric charge and the small amount of electric charge to the associated conductive line DLa or DLb.

Two sets of n-channel enhancement type switching transistor SW25 and capacitor CP1 are incorporated in the reference voltage generator 81b, and the n-channel enhancement type switching transistors SW25 are respectively gated by gate control signals CWL1 and CWL2. One of the gate control lines CWL1 and CWL2 is changed to the active high level, and the capacitor CP1 is connected to either conductive line DLa/DLb. The capacitance of the capacitor CP1 is determined in such a manner that the total capacitance of the capacitor CP1 and the parasitic capacitor coupled to the conductive line DLa/DLb is equal to the capacitance of the parasitic capacitor coupled to the bit line BLa/BLb, and, for this reason, the selected conductive line DLa/DLb and the selected bit line BLa/BLb are regulated to the reference voltage level Vref exactly adjusted to the mid point between the first potential level and the second potential level.

As will be appreciated from the foregoing description, the non-volatile ferroelectric memory device according to the present invention generates the reference voltage Vref exactly adjusted to the mid point between the first potential level and the second potential level by virtue of the capacitive means sharing the total of large/small amounts of electric charge with a selected bit line. Fluctuation of the process parameters equally affect the ferroelectric capacitors of the memory cells and the ferroelectric capacitors of the dummy memory cells, and is canceled between the ferroelectric capacitor of the memory cells and the ferroelectric capacitor of the dummy memory cells. For this reason, defective products due to improper reference voltage are drastically decreased.

Although particular embodiments of the present invention have been shown and described, it will be obvious to those skilled in the art that various changes and modifications may be made without departing from the spirit and scope of the present invention.

Figure 1:
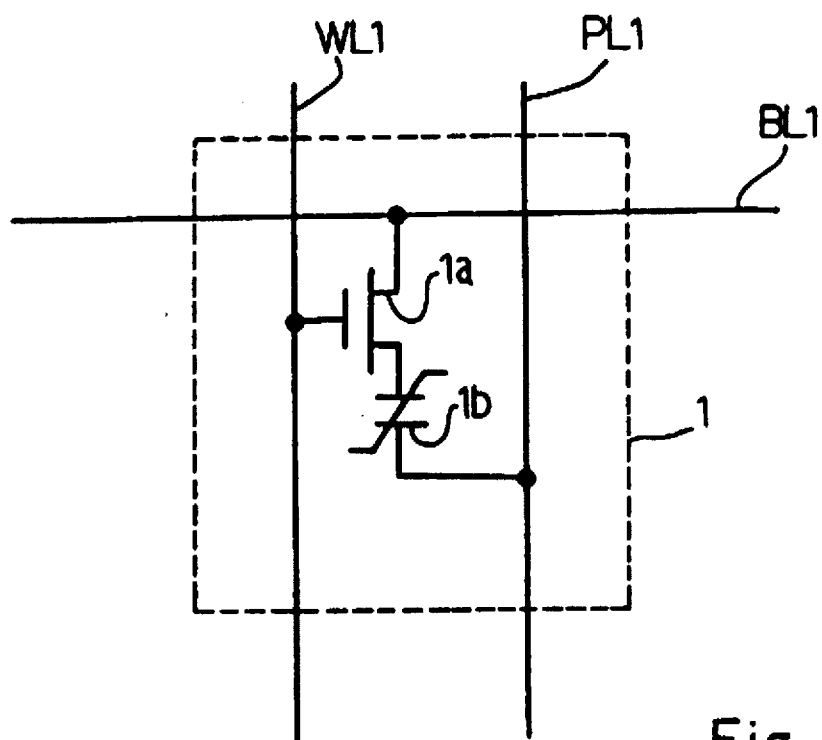
FIG. 1 is a circuit diagram showing the circuit configuration of the prior art non-volatile ferroelectric memory cell with the ferroelectric capacitor.
Figure 2:
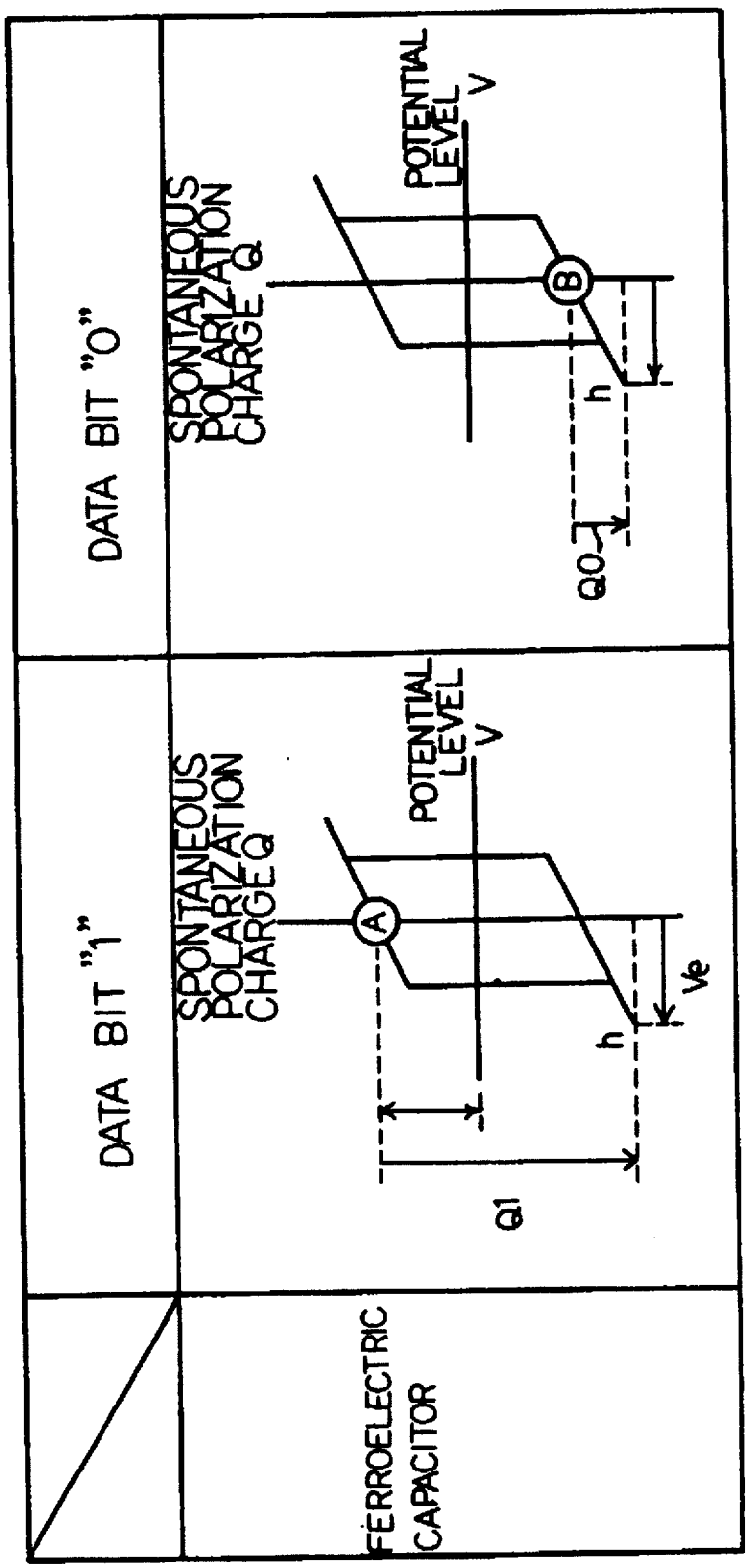
FIG. 2 is a view showing the relation between the spontaneous polarization charge and two logic levels of data bit.
Figure 3:
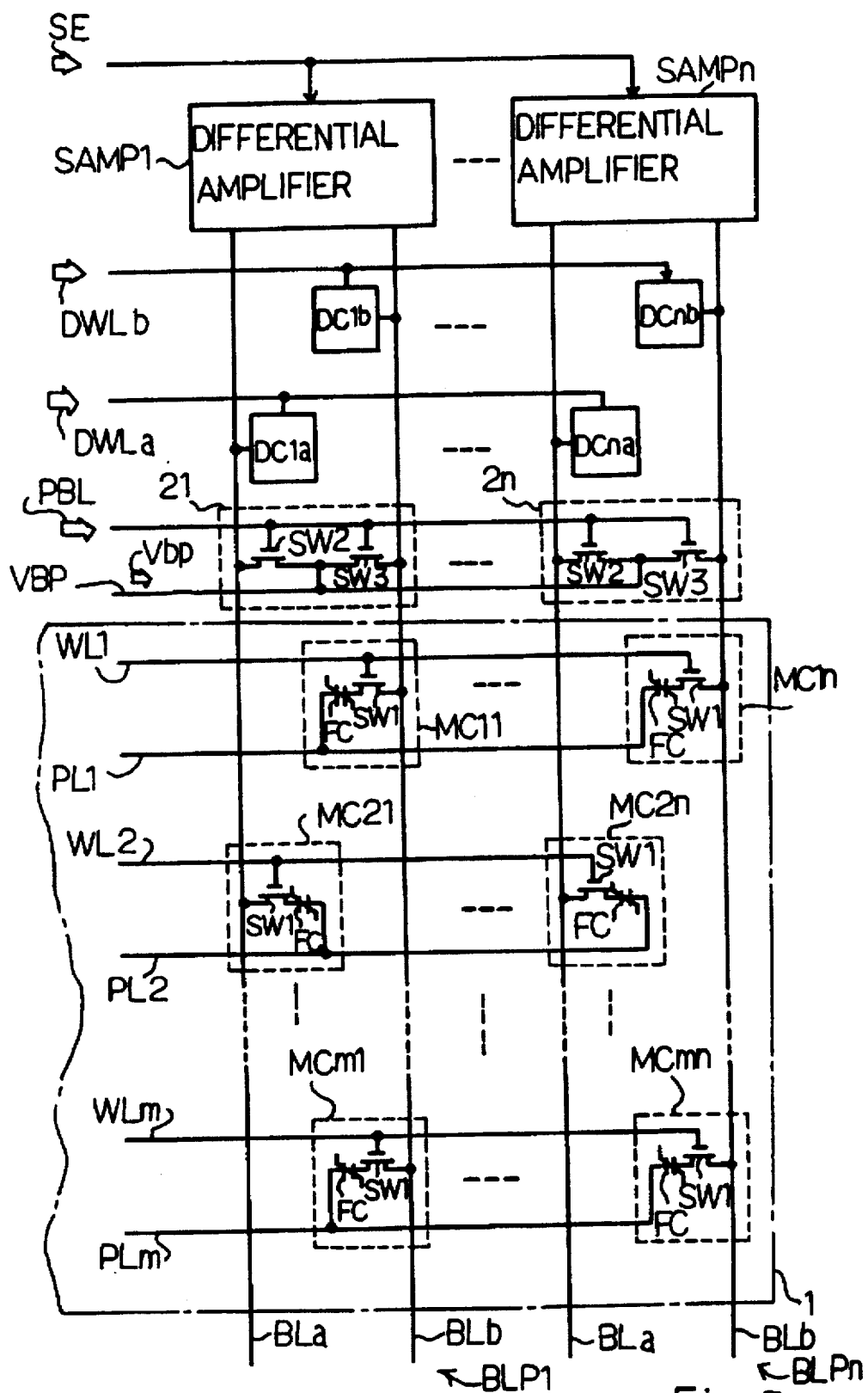
FIG. 3 is a circuit diagram showing the circuit arrangement of the prior art non-volatile ferroelectric memory device.
Figure 4:
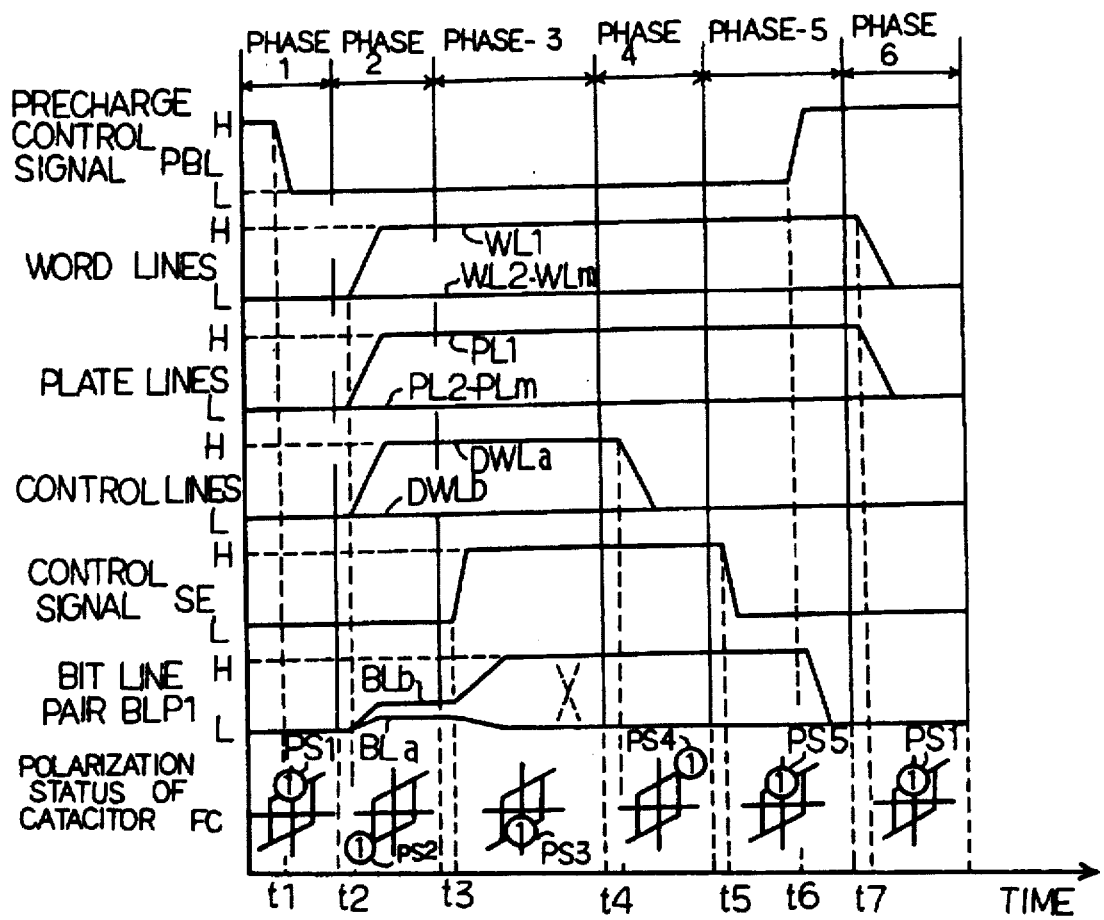
FIG. 4 is a timing chart showing the read-out of a data bit from the memory cell of the prior art non-volatile ferroelectric memory device.

For example, although the first embodiment is based on the prior art non-volatile ferroelectric memory device shown in FIGS. 3 and 4 the reference voltage generator according to the present invention is applicable to any kind of non-volatile ferroelectric memory device.

The first to fourth embodiments and their modifications may be selectively combined to form a non-volatile ferroelectric memory device according to the present invention.

What is claimed is:

1. A ferroelectric memory device comprising:
    a memory cell including a switching transistor and a capacitor having a dielectric film of a ferroelectric substance for supplying electric charge corresponding to a data logic level of "1" or "0" to a bit line, said electric charge producing a voltage level on said bit line; and
    a reference voltage generator supplying a reference voltage to another bit line for comparing said voltage level with said reference voltage in a read-out operation, and including dummy memory cells for generating electric charge corresponding to said data logic level of "1" and electric charge corresponding to said data logic level of "0", respectively,
    said reference voltage generator supplying the total of said electric charge corresponding to said data logic level of "1" and said electric charge corresponding to said data logic level of "0" to said another bit line to which a capacitance equivalent to two bit lines is coupled.

2. A non-volatile ferroelectric memory device comprising:
    a plurality of addressable memory cells each including a series combination of a first switching transistor and a storage capacitor for storing a data bit in one of first and second logic levels, said storage capacitor having a dielectric film of ferroelectric substance sandwiched between a first electrode and a second electrode so as to change a polarization status depending upon a potential between said first and second electrodes along a hysteresis loop;
    a plurality of bit line pairs selectively associated with said plurality of addressable memory cells, each of said plurality of bit line pairs including a first bit line and a second bit line to which input and output nodes of the first switching transistors of associated addressable memory cells are selectively connected;
    a plurality of plate lines selectively associated with said plurality of addressable memory cells, each of said plurality of plate lines being connected to the second electrodes of the storage capacitors of associated addressable memory cells;
    a plurality of word lines selectively connected to control nodes of the first switching transistors of said plurality of addressable memory cells, and selectively driven to an active level so that said first switching transistors of said associated addressable memory cells turn on for electrically connecting the first electrodes of the storage capacitors to the first bit lines or the second bit lines,
    said data bit in said first logic level stored in said storage capacitor of one of said plurality of memory cells supplying a large amount of electric charge from said first electrode through the associated first switching transistor to said first bit line of an associated bit line pair for generating a first potential level on said first bit line,
    said data bit in said second logic level stored in said storage capacitor of said one of said plurality of memory cells supplying a small amount of electric charge from said first electrode through the associated first switching transistor to said first bit line of said associated bit line pair for generating a second potential level on said first bit line;
    a reference voltage generator including a plurality of reference voltage sub-generators selectively associated with said plurality of bit line pairs, one of said reference voltage sub-generators associated with said associated bit line pair including
        a first dummy memory cell implemented by a series combination of a second switching transistor and a first dummy storage capacitor having a dielectric film of said ferroelectric substance sandwiched between third and fourth electrodes and storing a first dummy bit of said first logic level,
        a second dummy memory cell implemented by a series combination of a third switching transistor and a second dummy storage capacitor having a dielectric film of said ferroelectric substance sandwiched between fifth and sixth electrodes and storing a second dummy bit of said second logic level, and
        a capacitive means electrically connectable to said first dummy memory cell and said second dummy memory cell and having a capacitance approximately equal to a parasitic capacitance coupled to said second bit line,
        said first dummy storage capacitor and said second dummy storage capacitor supplying the total of said large amount of electric charge and said small amount of electric charge to the second bit line and said capacitive means so as to regulate said second bit line to a reference voltage level between said first potential level and said second potential level; and a plurality of sense amplifiers selectively connected to said plurality of bit line pairs, each of said plurality of sense amplifiers magnifying a potential difference between said first bit line and said second bit line of one of said plurality of bit line pairs.

3. The non-volatile ferroelectric memory device as set forth in claim 2, in which said capacitive means is one of the first bit line and the second bit line of one of said plurality of bit line pairs except for said associated bit line pair.

4. The non-volatile ferroelectric memory device as set forth in claim 3, further comprising a transfer gate circuit including a plurality of transfer gate sub-circuits, one of said plurality of transfer gate sub-circuits associated with said one of said plurality of reference voltage sub-generators having a fourth switching transistor coupled between said first dummy memory cell and said first bit line of said another of said plurality of bit line pairs, a fifth switching transistor coupled between said first dummy memory cell and said second bit line of said another of said plurality of bit line pairs, a sixth switching transistor coupled between said second dummy memory cell and said first bit line of said associated bit line pair, and a seventh switching transistor coupled between said second dummy memory cell and said second bit line of said associated bit line pair, said fourth and sixth switching transistors or said fifth and seventh switching transistors turning on so as to supply said total of said large amount of electric charge and said small amount of electric charge to said first bit lines or said second bit lines.

5. The non-volatile ferroelectric memory device as set forth in claim 2, in which said capacitive means is a capacitor having a capacitance approximately equal to said parasitic capacitance of said first bit line.

6. The non-volatile ferroelectric memory device as set forth in claim 5, further comprising a transfer gate circuit including a plurality of transfer gate subcircuits, one of said plurality of transfer gate sub-circuits associated with said one of said plurality of reference voltage sub-generators having a fourth switching transistor coupled between said first dummy memory cell and said second bit line of said associated bit line pair, and a fifth switching transistor coupled between said second dummy memory cell and said first bit line of said associated bit line pair, said fourth switching transistor or said fifth switching transistor turning on so as to supply said total of said large amount of electric charge and said small amount of electric charge to said capacitor and said second bit line.

7. The non-volatile ferroelectric memory device as set forth in claim 5, in which said capacitor and a third dummy memory cell identical with said second dummy memory cell are connected to said first dummy memory cell, and another capacitor identical with said capacitor and a fourth dummy memory cell identical with said first dummy memory cell are connected to said second dummy memory cell, a set of said first dummy memory cell, said third dummy memory cell and said capacitor or a set of said second dummy memory cell, said fourth dummy memory cell and said another capacitor being selectively connected to said first bit line or said second bit line of one of said plurality of bit line pairs.

8. The non-volatile ferroelectric memory device as set forth in claim 2, in which said one of said reference voltage sub-generator further includes a first conductive line electrically connectable through said second switching transistor to said first dummy storage capacitor, a second conductive line electrically connectable through said third switching transistor to said second dummy storage capacitor, an equalizing circuit coupled between said first conductive line and said second conductive line so as to merge said large amount of electric charge supplied from said first dummy storage capacitor with said small amount of electric charge supplied from said second dummy storage capacitor, a precharging circuit coupled between a precharge line and said first and second conductive lines for adjusting said first and second conductive lines to a precharge level before said large amount of electric charge and said small amount of electric charge are supplied from said first and second dummy capacitors to said first and second conductive lines, a data write-in circuit connected to said first and second conductive lines so as to restore said first dummy bit and said second dummy bit to said first dummy storage capacitor and said second dummy storage capacitor after said equalizing circuit electrically isolate said first conductive line from said second conductive line, and a dummy plate line connected to said fourth electrode and said sixth electrode for biasing said first and second dummy storage capacitors when said large amount of electric charge and said small amount of electric charge are supplied to said first conductive line and said second conductive line.

9. The non-volatile ferroelectric memory device as set forth in claim 8, in which said one of said reference voltage sub-generator further includes a fourth switching transistor coupled between a compensating potential line equal in potential level to said dummy plate line and a node between said second switching transistor and said first dummy storage capacitor, and a fifth switching transistor coupled between said compensating potential line and a node between said third switching transistor and said second dummy storage capacitor, said fourth and fifth switching transistors turning on at least while said second and third switching transistors are turned off.

10. The non-volatile ferroelectric memory device as set forth in claim 2, in which said associated bit line pair is regulated to an inactive level in a first phase of a data read-out cycle, and one of said plurality of word lines coupled to said first switching transistor of said one of said plurality of memory cells and one of said plurality of plate lines coupled to said storage capacitor of said one of said plurality of memory cells are changed from said inactive level to an active level in a second phase of said data read-out cycle after said first phase so as to cause said storage capacitor of said one of said plurality of memory cells to supply said large amount of electric charge or said small amount of electric charge to said first bit line of said associated bit line pair, said first and second dummy memory cells producing said reference voltage on said second bit line of said associated bit line pair in said second phase of said data read-out cycle for forming said potential difference, each of said plurality of sense amplifiers being activated in a third phase of said data read-out cycle after said second phase so as to magnify said potential difference, said active level and said inactive level forming said potential difference at an end of said third phase, said one of said plurality of plate lines being recovered from said active level to said inactive level in a fourth phase of said data read-out cycle after said third phase, said each of said plurality of sense amplifiers being deactivated so as to change said first bit line and said second bit line to said inactive level in a fifth phase of said data read-out cycle after said fourth phase, said one of said plurality of word lines being changed to said inactive level in a sixth phase of said data readout cycle after said fifth phase so as to electrically isolate said first bit line of said associated bit line pair from said storage capacitor of said one of said plurality of memory cells.

11. The non-volatile ferroelectric memory device as set forth in claim 2, in which said associated bit line pair is regulated to an inactive level in a first phase of a data read-out cycle, and one of said plurality of plate lines coupled to said storage capacitor of said one of said plurality of memory cells is maintained at an intermediate level between said inactive level and an active level through said data read-out cycle, one of said plurality of word lines coupled to said first switching transistor of said one of said plurality of memory cells being changed from said inactive level to said active level in a second phase of said data read-out cycle after said first phase so as to cause said storage capacitor of said one of said plurality of memory cells to supply said large amount of electric charge and said small amount of electric charge to said first bit line of said associated bit line pair, said first dummy memory cell and said second dummy memory cell producing said reference voltage on said second bit line of said associated bit line pair in said second phase of said data read-out cycle for producing said potential difference, each of said plurality of sense amplifiers being activated in a third phase of said data read-out cycle after said second phase so as to magnify said potential difference, said active level and said inactive level forming said potential difference at an end of said third phase, said first bit line and said second bit line of said associated bit line pair being precharged to said intermediate level in a fourth phase of said data read-out cycle after said third phase, said each of said plurality of sense amplifiers being deactivated in said fourth phase, said one of said plurality of word lines being changed to said inactive level in a fifth phase of said data read-out cycle after said fourth phase so as to electrically isolate said first bit line of said associated bit line pair from said storage capacitor of said one of said plurality of memory cells.

12. A method of reading out a data bit from a memory cell for storing a data bit in a ferroelectric capacitor in the form of polarization status, comprising the steps of:

a) equalizing a first bit line with a second bit line paired with said first bit line;

b) selecting at least one memory cell for supplying first electric charge representative of a data bit of logic "1" level or second electric charge representative of a data bit of logic "0" level to said first bit line for producing a first potential level representative of said data bit of logic "1" level or a second potential level representative of said data bit of logic "0" level on said first bit line;

c) supplying said first electric charge representative of a first dummy data bit and said second electric charge representative of a second dummy data bit from a first dummy ferroelectric capacitor and a second dummy ferroelectric capacitor to a capacitive means having a capacitance twice as large as a parasitic capacitance coupled to said second bit line for producing a reference voltage at an intermediate point between said first potential level and said second potential level on said second bit line;

d) magnifying a potential difference between said first bit line and said second bit line for quickly discriminating the logic level of said data bit read out to said first bit line; and e) restoring said data bit, said first dummy data bit and said second dummy data bit to said at least one memory cell, said first dummy ferroelectric capacitor and said second dummy ferroelectric capacitor, respectively.

13. The method as set forth in claim 12, in which said first bit line and said second bit line are connected to a precharge line fixed to an inactive level so as to regulate said first bit line and said second bit line to said inactive level in said step a), and said step b) and said step c) concurrently start the selection of said at least one memory cell and the supply of said first electric charge and said second electric charge to said capacitive means, said step b) including the sub-steps of b-1) changing one of word lines connected to a switching transistor of said at least one memory cell to an active level so as to electrically connect a ferroelectric capacitor of said at least one memory cell to said first bit line, and b-2) applying a bias to said ferroelectric capacitor so as to supply said first electric charge or said second electric charge to said first bit line, said inactive level and said active level forming said potential difference after the magnification in said step d), said step e) including the sub-steps of e-1) removing said bias from said ferroelectric capacitor, e-2) changing said first bit line and said second bit line to said inactive level, and e-3) recovering said one of word lines to said inactive level so as to cause said switching transistor to electrically isolate said ferroelectric capacitor from said first bit line.

14. The method as set forth in claim 12, in which said first bit line and said second bit line are regulated to said inactive level in said step a), and said step b) and said step c) concurrently start the selection of said at least one memory cell and the supply of said first electric charge and said second electric charge to said capacitive means, a potential level at the opposite electrode of a ferroelectric capacitor of said at least one memory cell to an electrode coupled to a switching transistor of said at least one memory cell being maintained at an intermediate level between an active level and an inactive level in said steps a) to e), said step b) including the sub-step of
- b-1) changing one of word lines connected to said switching transistor to said active level so as to electrically connect said ferroelectric capacitor to said first bit line, said inactive level and said active level forming said potential difference after the magnification in said step d), said step e) including the sub-steps of
- e-1) changing said first bit line and said second bit line to said intermediate level, and
- e-2) recovering said one of word lines to said inactive level so as to cause said switching transistor to electrically isolate said ferroelectric capacitor from said first bit line.

* * * * *